United States Patent
Tanaka et al.

(10) Patent No.: US 9,413,138 B2
(45) Date of Patent: Aug. 9, 2016

(54) METHOD OF CONTROLLING WAVELENGTH TUNABLE LASER, CONTROL DATA STRUCTURE OF WAVELENGTH TUNABLE LASER, AND WAVELENGTH TUNABLE LASER

(71) Applicant: SUMITOMO ELECTRIC DEVICE INNOVATIONS, INC., Yokohama-shi, Kanagawa (JP)

(72) Inventors: Hirokazu Tanaka, Yokohama (JP); Masao Shibata, Yokohama (JP); Hiromitsu Kawamura, Yokohama (JP); Mitsuyoshi Miyata, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 82 days.

(21) Appl. No.: 13/955,210

(22) Filed: Jul. 31, 2013

(65) Prior Publication Data

US 2014/0036940 A1 Feb. 6, 2014

(30) Foreign Application Priority Data

Jul. 31, 2012 (JP) ................. 2012-169377
Jun. 13, 2013 (JP) ................. 2013-124888

(51) Int. Cl.
  *H01S 5/06* (2006.01)
  *H01S 5/0687* (2006.01)
  *B82Y 20/00* (2011.01)
  *H01S 5/026* (2006.01)
  *H01S 5/028* (2006.01)
  (Continued)

(52) U.S. Cl.
  CPC ............. *H01S 5/0617* (2013.01); *B82Y 20/00* (2013.01); *H01S 5/0687* (2013.01); *H01S 5/028* (2013.01); *H01S 5/0265* (2013.01); *H01S 5/0612* (2013.01); *H01S 5/0683* (2013.01); *H01S 5/06256* (2013.01); *H01S 5/06258* (2013.01); *H01S 5/1209* (2013.01); *H01S 5/1212* (2013.01); *H01S 5/141* (2013.01); *H01S 5/34306* (2013.01)

(58) Field of Classification Search
  CPC . H01S 5/0617; H01S 5/0612; H01S 5/06256; H01S 5/0683; H01S 5/0687; H01S 5/06258; H01S 5/0265; H01S 5/028; H01S 5/1212; H01S 5/1209; H01S 5/141; H01S 5/34306
  See application file for complete search history.

(56) References Cited

U.S. PATENT DOCUMENTS

| 2004/0004980 | A1* | 1/2004 | Mazed ............................. 372/32 |
| 2004/0161248 | A1* | 8/2004 | Stewart et al. ................ 398/196 |
| 2009/0022186 | A1* | 1/2009 | Tanaka et al. ................... 372/20 |

FOREIGN PATENT DOCUMENTS

JP    2009-026996 A    2/2009

*Primary Examiner* — Xinning Niu

(74) *Attorney, Agent, or Firm* — Westerman, Hattori, Daniels & Adrian, LLP

(57) ABSTRACT

A method of controlling a wavelength tunable laser to control an oscillation wavelength based on a difference between a detection result of a wavelength by a wavelength detecting unit and a target value, the method includes: acquiring a first drive condition of the wavelength tunable laser to make the wavelength tunable laser oscillate at a first wavelength from a memory; calculating a second drive condition to drive the wavelength tunable laser at a second wavelength by referring to the first drive condition and a wavelength difference between the first wavelength and the second wavelength, the second wavelength differing from the first wavelength; and driving the wavelength tunable laser based on the second drive condition calculated at the calculating of the second drive condition.

14 Claims, 20 Drawing Sheets

(51) Int. Cl.
*H01S 5/0625* (2006.01)
*H01S 5/0683* (2006.01)
*H01S 5/12* (2006.01)
*H01S 5/14* (2006.01)
*H01S 5/343* (2006.01)

FIG. 3

| Ch | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $I_{m1}$ [μA] | $I_{m3}/I_{m2}$ A.U. | $C1$ [GHz/°C] |
|---|---|---|---|---|---|---|---|---|---|---|
| | | | INITIAL SETTING VALUE | | | | | FEEDBACK CONTROL TARGET VALUE | | TEMPERATURE CORRECTION FACTOR |
| 1 | 150.00 | 67.39 | 52.508 | 50.000 | 29.42 | 57.47 | 50.69 | 315.0 | 1.175 | -1.800 |
| 2 | 150.00 | 47.74 | 34.533 | 50.000 | 64.38 | 81.31 | 72.45 | 317.5 | 1.518 | |
| 3 | 150.00 | 50.86 | 38.727 | 50.000 | 59.05 | 77.71 | 69.12 | 313.0 | 1.229 | |
| ... | ... | ... | ... | ... | ... | ... | ... | ... | ... | |
| n | 150.00 | 54.77 | 54.046 | 50.000 | 41.24 | 43.32 | 11.69 | 317.2 | 1.441 | |

FIG. 7

| Ch | INITIAL SETTING VALUE | | | | | | | FEEDBACK CONTROL TARGET VALUE | | COEFFICIENT OF APPROXIMATE EQUATION | |
|---|---|---|---|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $I_{m1}$ [µA] | $I_{m3}/I_{m2}$ A.U. | A | B |
| 1 | 150.00 | 67.39 | 52.508 | 50.000 | 29.42 | 57.47 | 50.69 | 315.0 | 1.175 | -0.0136 | 0.8250 |
| 2 | 150.00 | 47.74 | 34.533 | 50.000 | 64.38 | 81.31 | 72.45 | 317.5 | 1.518 | | |
| 3 | 150.00 | 50.86 | 38.727 | 50.000 | 59.05 | 77.71 | 69.12 | 313.0 | 1.229 | | |
| ... | ... | ... | ... | ... | ... | ... | ... | ... | ... | | |
| n | 150.00 | 54.77 | 54.046 | 50.000 | 41.24 | 43.32 | 11.69 | 317.2 | 1.441 | | |

FIG. 8

| Ch | INITIAL SETTING VALUE | | | | | | | FEEDBACK CONTROL TARGET VALUE | | TEMPERATURE CORRECTION FACTOR |
|---|---|---|---|---|---|---|---|---|---|---|
| | $I_{LD}$ [mA] | $I_{SOA}$ [mA] | $T_{LD}$ [degC] | $T_{Fetalon}$ [degC] | $P_{Heater1}$ [mW] | $P_{Heater2}$ [mW] | $P_{Heater3}$ [mW] | $I_{m1}$ [μA] | $I_{m3}/I_{m2}$ A.U. | $C2$ [GHz/°C] |
| 1 | 150.00 | 67.39 | 52.508 | 50.000 | 29.42 | 57.47 | 50.69 | 315.0 | 1.175 | C2-1 |
| 2 | 150.00 | 47.74 | 34.533 | 50.000 | 64.38 | 81.31 | 72.45 | 317.5 | 1.518 | C2-2 |
| 3 | 150.00 | 50.86 | 38.727 | 50.000 | 59.05 | 77.71 | 69.12 | 313.0 | 1.229 | C2-3 |
| ... | ... | ... | ... | ... | ... | ... | ... | ... | ... | ... |
| n | 150.00 | 54.77 | 54.046 | 50.000 | 41.24 | 43.32 | 11.69 | 317.2 | 1.441 | C2-n |

METHOD OF CONTROLLING WAVELENGTH TUNABLE LASER, CONTROL DATA STRUCTURE OF WAVELENGTH TUNABLE LASER, AND WAVELENGTH TUNABLE LASER

CROSS-REFERENCE TO RELATED APPLICATION

This application is based upon and claims the benefit of priority of the prior Japanese Patent Applications No. 2012-169377, filed on Jul. 31, 2012 and No. 2013-124888, filed on Jun. 13, 2013, the entire contents of which are incorporated herein by reference.

BACKGROUND (i) Technical Field

The present invention relates to a method of controlling a wavelength tunable laser, a control data structure of a wavelength tunable laser, and a wavelength tunable laser.

(ii) Related Art

Japanese Patent Application Publication No. 2009-026996 (Patent Document 1) discloses a wavelength tunable laser capable of selecting an output wavelength.

SUMMARY

The technique of Patent Document 1 stores control conditions to obtain a grid wavelength defined by the ITU-T (International Telecommunication Union Telecommunication Standardization Sector) (hereinafter, described as a grid wavelength) in a memory, and performs control to cause oscillation at a wavelength out of grid wavelengths based on the stored control condition. Thus, it is impossible to perform control to cause oscillation at a wavelength other than the grid wavelengths. To cause the oscillation at a wavelength other than the grid wavelengths, control conditions for respective wavelengths need to be stored in the memory, but this makes amounts of data huge and thus is not practical. In addition, the tuning is necessary in tests before shipment to obtain the control conditions, but this takes an immense amount of time and thus is not practical.

It is an object to provide a method of controlling a wavelength tunable laser, a control data structure of a wavelength tunable laser, and a wavelength tunable laser capable of selecting an arbitrary wavelength.

According to an aspect of the present invention, there is provided a method of controlling a wavelength tunable laser to control an oscillation wavelength based on a difference between a detection result of a wavelength by a wavelength detecting unit and a target value, the method including: acquiring a first drive condition of the wavelength tunable laser to make the wavelength tunable laser oscillate at a first wavelength from a memory; calculating a second drive condition to drive the wavelength tunable laser at a second wavelength by referring to the first drive condition and a wavelength difference between the first wavelength and the second wavelength, the second wavelength differing from the first wavelength; and driving the wavelength tunable laser based on the second drive condition calculated at the calculating of the second drive condition.

According to another aspect of the present invention, there is provided a control data structure of a wavelength tunable laser including: a first data table storing drive conditions to make a wavelength tunable laser oscillate in association with different wavelengths; and a second data table storing a rate of change of wavelength of the drive condition.

According to another aspect of the present invention, there is provided a wavelength tunable laser capable of controlling an output wavelength, the wavelength tunable laser including: a controller that performs control to calculate, based on a drive condition of the wavelength tunable laser to make the wavelength tunable laser laser-oscillate at a first wavelength and a difference between the first wavelength and a second wavelength, a drive condition to drive the wavelength tunable laser at the second wavelength, and performs control to make the wavelength tunable laser oscillate at the second wavelength based on the calculated drive condition, the second wavelength differing from the first wavelength.

According to another aspect of the present invention, there is provided a wavelength tunable laser including: a memory that stores drive conditions in association with discrete wavelengths in a wavelength tunable band; and a control unit that acquires, when a specified required wavelength is a wavelength between the discrete wavelengths, a drive condition to achieve the specified required wavelength by calculation, and performs drive control at the required wavelength.

BRIEF DESCRIPTION OF THE DRAWINGS

FIG. 3 is a diagram listing setting values and control target values;

FIG. 7 illustrates a data table storing a slope A and an intercept B instead of a temperature correction factor FIG. 8 illustrates a data table including a wavelength correction factor $C_2$ of the etalon;

DETAILED DESCRIPTION

Hereinafter, a description will be given of embodiments of the present invention.

First Embodiment

Figure 1:
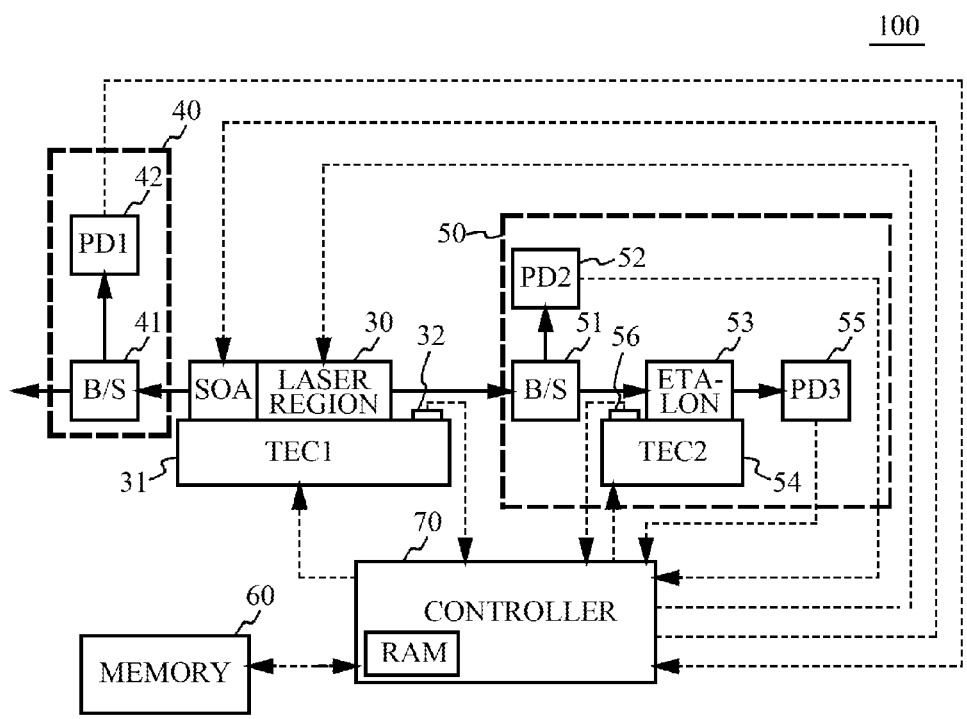
FIG. 1 is a block diagram illustrating an overall configuration of a laser device in accordance with a first embodiment.

FIG. 1 is a block diagram illustrating an overall configuration of a wavelength tunable laser 100 in accordance with a first embodiment. As illustrated in FIG. 1, the wavelength tunable laser 100 includes a semiconductor laser 30 (tunable semiconductor laser) capable of controlling a wavelength as a laser device. The semiconductor laser 30 of the present embodiment has a region that is coupled to a laser region to be an SOA (Semiconductor Optical Amplifier). The SOA functions as an optical output control unit. The SOA can arbitrarily increase and decrease intensity of an optical output. In addition, it can control intensity of an optical output to be practically zero. The wavelength tunable laser 100 further includes an output detecting unit 40, a wavelength locker unit 50, a memory 60, and a controller 70. The controller 70 controls the wavelength tunable laser 100, and includes a RAM (Random Access Memory) thereinside.

Figure 2:
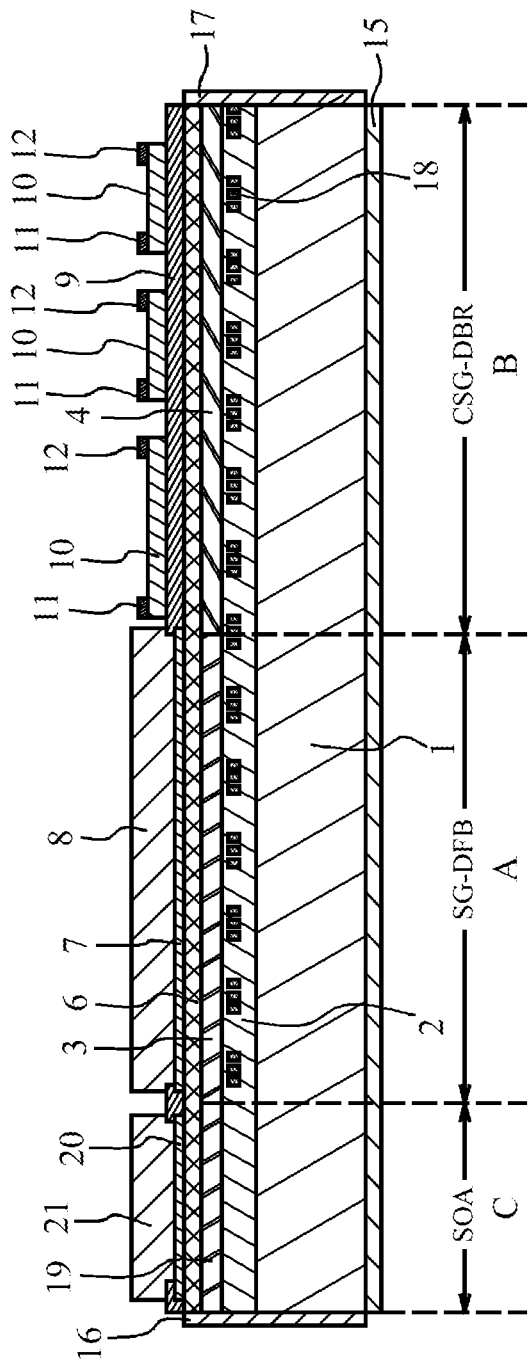
FIG. 2 is a schematic cross-sectional view illustrating an overall structure of a semiconductor laser.

FIG. 2 is a schematic cross-sectional view illustrating an overall structure of the semiconductor laser 30 in the present embodiment. As illustrated in FIG. 2, the semiconductor laser 30 includes an SG-DFB (Sampled Grating Distributed Feedback) region A, a CSG-DBR (Chirped Sampled Grating Distributed Bragg Reflector) region B, and an SOA (Semiconductor Optical Amplifier) region C. In other words, the semiconductor laser 30 is a laser including a wavelength selecting mirror in a semiconductor structure.

As an example, in the semiconductor laser 30, located are the SOA region C, the SG-DFB region A, and the CSG-DBR region B in this order from the front side to the rear side. The SG-DFB region A has a gain, and includes sampled gratings. The CSG-DBR region B does not have a gain, and includes sampled gratings. The SG-DFB region A and the CSG-DBR region B correspond to the laser region in FIG. 1, and the SOA region C corresponds to the SOA region in FIG. 1.

The SG-DFB region A has a structure including a lower clad layer 2, an active layer 3, an upper clad layer 6, a contact layer 7, and an electrode 8 stacked on a substrate 1 in this order from the substrate 1 side. The CSG-DBR region B has a structure including the lower clad layer 2, an optical waveguide layer 4, the upper clad layer 6, an insulating film 9, and heaters 10 stacked on the substrate 1 in this order from the substrate 1 side. Each of the heaters 10 includes a power source electrode 11 and a ground electrode 12. The SOA region C has a structure including the lower clad layer 2, an optical amplification layer 19, the upper clad layer 6, a contact layer 20, and an electrode 21 stacked on the substrate 1 in this order from the substrate 1 side.

The substrate 1, the lower clad layer 2, and the upper clad layer 6 are integrally formed across the SG-DFB region A, the CSG-DBR region B, and the SOA region C. The active layer 3, the optical waveguide layer 4, and the optical amplification layer 19 are formed on the same surface. The boundary between the SG-DFB region A and the CSG-DBR region B corresponds to the boundary between the active layer 3 and the optical waveguide layer 4.

A facet film 16 is formed on facets of the substrate 1, the lower clad layer 2, the optical amplification layer 19, and the upper clad layer 6 at the SOA region C side. In the present embodiment, the facet film 16 is an AR (Anti Reflection) film. The facet film 16 functions as a front facet of the semiconductor laser 30. A facet film 17 is formed on facets of the substrate 1, the lower clad layer 2, the optical waveguide layer 4, and the upper clad layer 6 at the CSG-DBR region B side. In the present embodiment, the facet film 17 is an AR film. The facet film 17 functions as a rear facet of the semiconductor laser 30.

The substrate 1 is a crystal substrate made of, for example, n-type InP. The lower clad layer 2 is of an n-type, the upper clad layer 6 is of a p-type, and they are made of, for example, InP. The lower clad layer 2 and the upper clad layer 6 confine a light beam in the active layer 3, the optical waveguide layer 4, and the optical amplification layer 19.

The active layer 3 is formed of a semiconductor having a gain. The active layer 3 has, for example, a quantum well structure, and has a structure including, for example, a well layer made of $Ga_{0.32}In_{0.68}As_{0.92}P_{0.08}$ with a thickness of 5 nm and a barrier layer made of $Ga_{0.22}In_{0.78}As_{0.47}P_{0.53}$ with a thickness of 10 nm alternately stacked. The optical waveguide layer 4 may be made of, for example, a bulk semiconductor layer, and may be made of, for example, $Ga_{0.22}In_{0.78}As_{0.47}P_{0.53}$. In the present embodiment, the optical waveguide layer 4 has an energy gap greater than that of the active layer 3.

The optical amplification layer 19 has a gain and amplifies a light beam when electrical current is supplied to the optical amplification layer 19 from the electrode 21. The optical amplification layer 19 may have a quantum well structure for example, and may have a structure including, for example, a well layer made of $Ga_{0.35}In_{0.65}As_{0.99}P_{0.01}$ with a thickness of 5 nm and a barrier layer made of $Ga_{0.15}In_{0.85}As_{0.32}P_{0.68}$ with a thickness of 10 nm alternately stacked. A bulk semiconductor made of $Ga_{0.44}In_{0.56}As_{0.95}P_{0.05}$ may be used as the optical amplification layer 19. The optical amplification layer 19 and the active layer 3 may be made of the same material.

The contact layers 7, 20 are made of, for example, a p-type $Ga_{0.47}In_{0.53}As$ crystal. The insulating film 9 is a protective film made of a silicon nitride (SiN) film or silicon oxide (SiO) film. The heater 10 is a thin film resistor such as titanium tungsten (TiW). Each of the heaters 10 may be formed across two or more segments of the CSG-DBR region B.

The electrodes 8, 21, the power source electrode 11, and the ground electrode 12 are made of a conductive material such as gold (Au). A back-surface electrode 15 is formed under the substrate 1. The back-surface electrode 15 is formed across the SG-DFB region A, the CSG-DBR region B, and the SOA region C.

The facet film 16 and the facet film 17 are AR films with a reflectance less than or equal to 1.0%, and thereby makes the facet substantially anti-reflection. The AR film may be a dielectric film made of, for example, $MgF_2$ and TiON. In the present embodiment, the both facets of the laser are AR films, but there may be a case where the facet film 17 is made of a reflection film with a significant reflectance. When a semiconductor contacting the facet film 17 in FIG. 2 has a structure having a light-absorbing layer, optical output leaking to the outside from the facet film 17 can be reduced by configuring the facet film 17 to have a significant reflectance. The significant reflectance may be a reflectance greater than or equal to, for example, 10%. The reflectance means a reflectance with respect to an inner portion of the semiconductor laser.

Diffractive gratings (corrugations) 18 are formed in the lower clad layer 2 of the SG-DFB region A and the CSG-DBR region B at predetermined intervals. This forms sampled gratings in the SG-DFB region A and the CSG-DBR region B. The SG-DFB region A and the CSG-DBR region B have two or more segments in the lower clad layer 2. Here, the segment is a region where a single diffractive grating portion including the diffractive grating 18 and a single space portion not including the diffractive grating 18 are combined. That is to say, the segment is a region where the space portion of which both ends are sandwiched by the diffractive grating portions and the diffractive grating portion are combined. The diffractive grating 18 is made of a material with a refractive index different from that of the lower clad layer 2. When the lower clad layer 2 is InP, $Ga_{0.22}In_{0.78}As_{0.47}P_{0.53}$ may be used as a material to form the diffractive grating. The diffractive gratings 18 may be formed by patterning with a dual beam interference exposure method. The space portion located between the diffractive gratings 18 may be formed by exposing a resist with a pattern of the diffractive grating 18 and then exposing an area of the resist corresponding to the space portion. The pitch of the diffractive grating 18 in the SG-DFB region A may be the same as or different from the pitch of the diffractive grating 18 in the CSG-DBR region B. The present embodiment configures both pitches to be the same as an example. The diffractive gratings 18 may have the same length, or different lengths in each segment. The diffractive gratings 18 of the SG-DFB region A may have the same length, the diffractive gratings 18 of the CSG-DBR region B may have the same length, and the diffractive gratings 18 of the SG-DFB region A may have a different length from those of the CSG-DBR region B.

In the SG-DFB region A, the segments practically have the same optical length. In the CSG-DBR region B, at least two of the segments have different optical lengths. Thus, peak intensity of wavelength characteristics of the CSG-DBR region B depends on wavelength. The average optical length of the segments of the SG-DFB region A differs from the average optical length of the segments of the CSG-DBR region B. As described above, the segments in the SG-DFB region A and the segments in the CSG-DBR region B form a resonator in the semiconductor laser 30.

Reflected light beams interfere with each other inside the SG-DFB region A and the CSG-DBR region B. The SG-DFB region A includes the active layer 3, and thus generates discrete gain spectra with a predetermined wavelength interval of which peak intensities are approximately the same when a carrier is supplied. In addition, the CSG-DBR region B generates discrete reflectance spectra with a predetermined wavelength interval of which peak intensities differ from each other. An interval between peak wavelengths of wavelength characteristics in the SG-DFB region A differs from that in the CSG-DBR region B. The vernier effect caused by the combination of the wavelength characteristics enables to select a wavelength satisfying an oscillation condition.

As illustrated in FIG. 1, the semiconductor laser 30 is located on a first temperature control device 31. The first temperature control device 31 includes a Peltier element, and functions as a TEC (Thermoelectric cooler). A first thermistor 32 is located on the first temperature control device 31. The first thermistor 32 detects temperature of the first temperature control device 31. The detected temperature by the first thermistor 32 enables to determine the temperature of the semiconductor laser 30.

The output detecting unit 40 includes a beam splitter 41 and a first light receiving element 42. The beam splitter 41 is located at a position where it can split an output light beam from the front side of the semiconductor laser 30. The first light receiving element 42 is located at a position where it can receive a first light beam of two light beams split by the beam splitter 41.

The wavelength locker unit 50 includes a beam splitter 51, a second light receiving element 52, an etalon 53, a second temperature control device 54, a third light receiving element 55, and a second thermistor 56. The beam splitter 51 is located at a position where it can split an output light beam from the rear side of the semiconductor laser 30. The second light receiving element 52 is located at a position where it can receive a first light beam of two light beams split by the beam splitter 51.

The transmittance of the etalon 53 with respect to the wavelength of an incident light beam periodically changes. The present embodiment uses a solid etalon as the etalon 53. The periodical wavelength characteristics of the solid etalon change as the temperature changes. The etalon 53 is located at a position where it can transmit a second light beam of the two light beams split by the beam splitter 51. The etalon 53 is located on the second temperature control device 54. The second temperature control device 54 includes a Peltier element, and functions as a TEC (Thermoelectric cooler).

The third light receiving element 55 is located at a position where it can receive a light beam transmitted through the etalon 53. The second thermistor 56 is provided to determine the temperature of the etalon 53. The second thermistor 56 is located on, for example, the second temperature control device 54. The present embodiment detects the temperature of the second temperature control device 54 with the second thermistor 56 to determine the temperature of the etalon 53.

The memory 60 is a rewritable storage device. The exemplary rewritable storage device is a flash memory. The controller 70 includes a Central Processing Unit (CPU), a RAM (Random Access Memory), and a power source. The RAM is a memory that temporarily stores programs executed by the central processing unit and data processed by the central processing unit.

The memory 60 stores initial setting values and feedback control target values for respective components of the wavelength tunable laser 100 in association with each channel. The channel is a number corresponding to each oscillation wavelength of the semiconductor laser 30. For example, the channels correspond to ITU-T (International Telecommunication Union Telecommunication Standardization Sector) grids. Hereinafter, a wavelength corresponding to each channel is described as a grid wavelength.

FIG. 3 is a diagram listing the above described initial setting values and feedback control target values. As illustrated in FIG. 3, the above described initial setting values include an initial current value $I_{LD}$ supplied to the electrode 8 of the SG-DFB region A, an initial current value $I_{SOA}$ supplied to the electrode 21 of the SOA region C, an initial temperature value $T_{LD}$ of the semiconductor laser 30, an initial temperature value $T_{Etalon}$ of the etalon 53, initial electric power values $P_{Heater1}$ to $P_{Heater3}$ supplied to respective heaters 10. These initial setting values are determined with respect to each channel corresponding to the grid wavelength. The above described feedback control target values are target values used when the controller 70 performs feedback control. The feedback control target values include a target value $T_{m1}$ of photocurrent output from the first light receiving element 42, and a target value $I_{m3}/I_{m2}$ of a ratio of photocurrent $I_{m3}$ output from the third light receiving element 55 to photocurrent $I_{m2}$ output from the second light receiving element 52. The feedback control target values are also determined with respect to each channel. Further, the memory 60 stores a temperature correction factor C1. The temperature correction factor C1 will be described in detail later. In the present embodiment, the temperature correction factor C1 is common to all the grid wavelengths. The above described values are obtained with respect to each wavelength tunable laser 100 before shipment by tuning with a wavemeter.

A description will next be given of an operation of the wavelength tunable laser 100 to output one of the grid wavelengths with reference to FIG. 1 to FIG. 3. The controller 70 first acquires information about a required channel from the outside. The controller 70 acquires, based on the information about the required channel, the initial setting values and the feedback control target values associated with the required channel from the memory, and writes them to the embedded RAM. The controller 70 then supplies electric current with the initial current value $I_{LD}$ associated with the channel to the electrode 8 of the semiconductor laser 30.

In addition, the controller 70 supplies electric current to the first temperature control device 31 so that the initial temperature value $T_{LD}$ associated with the channel is achieved. This controls the temperature of the semiconductor laser 30 to be the initial value. Moreover, the controller 70 supplies electric power with the initial electric power values $P_{Heater1}$ to $P_{Heater3}$ associated with the channel to respective heaters 10. This makes the heaters 10 generate heat at a predetermined temperature. The temperature control of the first temperature control device 31 and the temperature control of the heaters 10 allow the semiconductor laser 30 to oscillate at the grid wavelength corresponding to the required channel. In addition, the controller 70 supplies electric current with the initial current value $I_{SOA}$ associated with the channel to the electrode 21 of the SOA region C. This enables to control the optical intensity of a laser beam emitted from the front of the semiconductor laser 30 to be the initial value. The semiconductor laser 30 laser-oscillates based on the initial values set as described above. However, this state provides no assurance that the oscillation wavelength is a wavelength same as the selected grid wavelength or a predetermined level of optical intensity is achieved. Thus, the wavelength and the output optical intensity are feedback-controlled.

The controller 70 performs Auto Power Control (APC) and Auto Frequency Control (AFC) as the above described feedback control. More specifically, the controller 70 feedback-controls the electric current $I_{SOA}$ supplied to the electrode 21 of the SOA region C so that a photocurrent value output from the first light receiving element 42 becomes the target value $I_{m1}$ associated with the channel as the auto power control. This enables to control the output optical intensity of the semiconductor laser 30 to be a desired value associated with the channel. In addition, the controller 70 controls the temperature of the semiconductor laser 30 so that the ratio $I_{m3}/I_{m2}$, which is a ratio of the photocurrent $I_{m3}$ output from the third light receiving element 55 to the photocurrent $I_{m2}$ output from the second light receiving element 52, becomes the target value $I_{m3}/I_{m2}$ as the auto frequency control. This enables to control the output optical wavelength of the semiconductor laser 30 to be the grid wavelength corresponding to the channel. The controller 70 controls drive electric power of the second temperature control device 54 so that the initial temperature value $T_{Etalon}$ associated with the channel is achieved. The electric power supplied to the second temperature control device 54 is feedback-controlled based on the detection result of the second thermistor 56, and thus the temperature of the etalon 53 is controlled to be a predetermined value.

Figure 4:
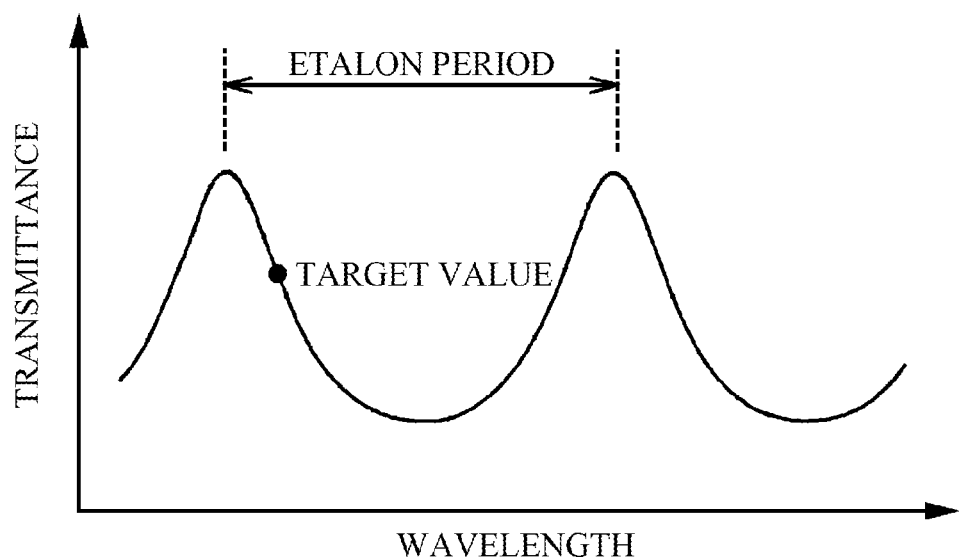
FIG. 4 is a diagram illustrating wavelength characteristics of an etalon.

Here, a description will be given of the principle of wavelength control using the ratio $I_{m3}/I_{m2}$. FIG. 4 is a diagram illustrating wavelength characteristics of the etalon 53. In FIG. 4, the horizontal axis represents an input wavelength to the etalon 53, and the vertical axis represents transmittance of the etalon 53. As illustrated in FIG. 4, the transmittance of the etalon 53 with respect to the wavelength periodically changes. Hereinafter, an interval between the wavelengths at the adjoining local maximum values (or local minimum values) of the transmittance is referred to as an etalon period. The etalon period is approximately 100 GHz for example.

The etalon 53 has the characteristics illustrated in FIG. 4, and thus the wavelength of a light beam input to the etalon 53 is determined by obtaining the ratio of the optical intensity output from the etalon 53 to the optical intensity input to the etalon 53. The optical intensity input to the etalon 53 is indicated by the photocurrent $I_{m2}$ output from the second light receiving element 52. The optical intensity output from the etalon 53 is indicated by the photocurrent $I_{m3}$ output from the third light receiving element 55. Thus, the wavelength of a light beam input to the etalon 53 is determined by $I_{m3}/I_{m2}$. Therefore, the desired wavelength output is achieved by feedback-controlling the parameters of the semiconductor laser 30 with use of the ratio $I_{m3}/I_{m2}$ as a target value for the wavelength control. The semiconductor laser 30 of the present embodiment controls the temperature of the first temperature control device 31 as a wavelength parameter.

The target value of the ratio $I_{m3}/I_{m2}$ is preferably located in a slant part between the local maximum value and the local minimum value of the transmittance of the etalon 53. A change in transmittance with respect to a change in wavelength is small around the local maximum value and the local minimum value of the transmittance, and thus a slight shift of the ratio $I_{m3}/I_{m2}$ from the target value greatly changes an oscillation wavelength.

When the grid wavelength of each channel is set to the ITU-T grid wavelength, the etalon period is designed to be the ITU-T grid wavelength interval. In this case, it is not necessary to change the wavelength characteristics of the etalon 53 to achieve any of the grid wavelengths. Thus, the temperature of the etalon 53 is controlled to be the same at any grid wavelengths.

As described above, the achievement of the grid wavelength requires laser oscillation with the initial setting values and the feedback control target value to force its wavelength to be a predetermined target value. The memory 60 stores only the initial setting values and the feedback control target values in association with each grid wavelength, and thus a wavelength other than the grid wavelengths is difficult to be achieved.

The present embodiment selects a grid wavelength close to a required wavelength (a wavelength other than the grid wavelengths) as a reference wavelength and reads out the initial setting values and the feedback control target values associated with the selected grid wavelength from the memory 60 to achieve the wavelength other than the grid wavelengths. The initial setting values or the feedback control target values are then calculated based on the difference between the required wavelength and the reference wavelength.

In the present invention, the above described reference wavelength may be referred to as a first wavelength, and the required wavelength may be referred to as a second wavelength. These prerequisites apply to other embodiments. In addition, the required wavelength is an arbitrary wavelength that differs from the reference wavelength by less than or equal to the grid wavelength interval. This also applies to other embodiments. The present embodiment modifies the target value $T_{Etalon}$ of the second temperature control device 54 out of the initial setting values associated with the selected reference wavelength by calculation, and makes the semiconductor laser 30 oscillate at a wavelength different from the grid wavelength with use of the modified target value.

Figure 5:
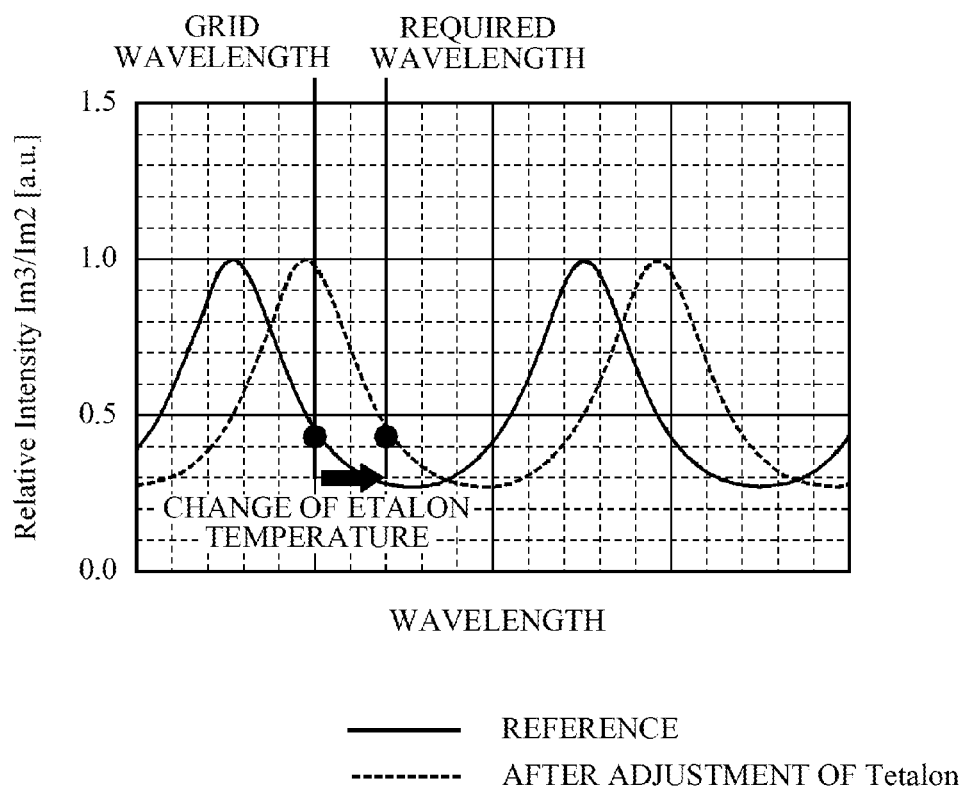
FIG. 5 is a diagram illustrating the principle of a method of controlling a wavelength in accordance with the first embodiment.

FIG. 5 is a diagram illustrating the principle of a method of controlling a wavelength in accordance with the present embodiment. In FIG. 5, the horizontal axis represents wavelength, and the vertical axis represents a normalized value of the ratio $I_{m3}/I_{m2}$ (the transmittance of the etalon 53). In FIG. 5, the solid line represents wavelength characteristics at a temperature of the initial temperature value $T_{Etalon}$ of the etalon 53. In addition, the dotted line represents wavelength characteristics when the temperature of the etalon 53 is raised by the second temperature control device 54. Here, when the ratio $I_{m3}/I_{m2}$ at the black circle on the solid line is used as the feedback control target value and the temperature of the etalon 53 is the initial temperature value $T_{Etalon}$, the oscillation at a grid wavelength (reference wavelength) occurs. On the other hand, when the etalon 53 has a temperature corresponding to the wavelength characteristics presented by the dotted line, the actual oscillation wavelength shifts from the grid wavelength by the amount of change in the etalon characteristics even though the ratio $I_{m3}/I_{m2}$ is a value (the black circle on the dotted line) to obtain the grid wavelength (reference wavelength). That is to say, the shift of the etalon characteristics by the wavelength difference between the required wavelength and the grid wavelength (reference wavelength) enables to achieve the required wavelength while maintaining the ratio $I_{m3}/I_{m2}$ that is the feedback control target value. In other words, the present embodiment calculates a temperature to change an etalon temperature based on a wavelength difference ΔF between the required wavelength and the reference wavelength (grid wavelength), and uses the calculated temperature as the etalon temperature to achieve the required wavelength.

As described above, the wavelength characteristics of the etalon 53 shift as its temperature changes. An amount of frequency change/an amount of temperature change [GHz/° C.] in the etalon 53 is referred to as the temperature correction factor C1 of the etalon 53. Here, the wavelength is expressed by the frequency. The temperature correction factor C1 corresponds to a rate of change of wavelength of the drive condition of the wavelength tunable laser.

Tetln_A [° C.] is a setting temperature of the etalon 53 to achieve the control of the required wavelength. Tetln_B [° C.] is an initial temperature of the etalon 53, i.e. a temperature of the etalon 53, associated with the grid wavelength corresponding to the selected reference wavelength. Tetln_B corresponds to $T_{Etalon}$, and is obtained from the memory 60. Further, the grid wavelength of the current channel is set as the reference wavelength, and a wavelength difference between the reference wavelength and the required wavelength is expressed by ΔF [GHz]. In this case, the relationship among the parameters is expressed by the following equation (1). The setting temperature Tetln_A necessary to obtain the required wavelength may be calculated based on the equation (1).

$$\text{Tetln}\_A = \text{Tetln}\_B + \Delta F/C1 \qquad (1)$$

Controlling the temperature of the second temperature control device 54 to be the setting temperature Tetln_A enables to obtain the required wavelength without modifying the ratio $I_{m3}/I_{m2}$.

The following describes tangible examples. Assume that 196.1070 [THz] is specified as the required wavelength. The required wavelength is normally directly indicated to the controller 70 from an external unit (not illustrated) as a value. The required wavelength at this point is accepted across the entire area of the wavelength band between the grid wavelengths stored in the memory 60. In other words, even though the input required wavelength does not correspond to the grid wavelength, the input is not refused. In addition, the wavelength tunable laser 100 is designed to be capable of controlling wavelength across the wavelength range between the grid wavelength and the adjoining grid wavelength at a longer side in which the input required wavelength is included. Thus, it is sufficient if a shift width of the wavelength characteristics of the etalon 53 is variable across a range of the difference between adjoining grid wavelengths as described later.

The controller 70 then performs an operation to obtain the etalon temperature Tetln_B associated with the reference wavelength based on the indicated required wavelength. Here, the wavelength closest to the required wavelength is employed as the reference wavelength among the grid wavelengths stored in the memory 60.

The memory 60 stores the initial setting values in the manner of the data table illustrated in FIG. 3. As illustrated in FIG. 3, the channel numbers Ch are given as a key in the data table storing the initial setting values. The initial setting values are prepared with respect to each grid wavelength. The grid wavelengths are discretely determined in the wavelength tunable band of the wavelength tunable laser 100. The ITU grid having an interval of 50 GHz is usually used, but other grid may be used. For example, the initial setting values may be prepared at intervals narrower than the interval of the ITU grid wavelength.

Further, the memory 60 stores a wavelength with a maximum value or minimum value (start grid wavelength) out of the grid wavelengths stored in the data table illustrated in FIG. 3 and the wavelength difference between the grids (grid interval wavelength), which are not illustrated. The controller 70 obtains the channel number Ch corresponding to the reference wavelength by performing calculation using the indicated required wavelength based on these parameters.

Usually, the difference between the required wavelength and the start grid wavelength is calculated, and the integer portion of the calculated difference divided by the grid interval wavelength is employed as the channel number Ch. The controller 70 then obtains the etalon temperature Tetalon as the etalon temperature Tetln_B from the initial setting values associated with the obtained channel number Ch. Here, assume that Tetln_B is 40.000 [° C.]. In addition, the controller 70 obtains the grid wavelength associated with the channel number Ch obtained by the calculation as the reference wavelength, and calculates a difference in wavelength between the reference wavelength and the required wavelength (wavelength difference ΔF). The reference wavelength is normally obtained by adding the product of the value obtained as the channel number Ch and the grid interval wavelength to the start grid wavelength. Here, the reference wavelength is 196.1000 [THz]. The calculation of the difference between the required wavelength and the reference wavelength obtained as described above enables to obtain the wavelength difference ΔF. Here, the wavelength difference ΔF obtained by the calculation is +7.0 [GHz].

A difference between the start grid wavelength and the required wavelength may be calculated and a remainder of the difference divided by the grid wavelength interval may be set as the wavelength difference ΔF. The reference wavelength is not used in the above described calculation. However, the wavelength difference ΔF resulting from the calculation also corresponds to the difference between the required wavelength and the reference wavelength, and thus the reference wavelength is not necessary to be actively calculated to obtain the wavelength difference ΔF.

The controller 70 then refers to the temperature correction factor C1 from the memory 60. The temperature correction factor C1 is determined by the characteristics of the etalon 53, and usually stored in the memory 60 in advance. Here, assume that the temperature correction factor C1 is −1.800 [GHz/° C.]. The controller 70 then calculates Tetln_A with the equation (1). Tetln_A calculated here is 36.111 [° C.].

The controller 70 then controls the wavelength tunable laser 100 while setting the temperature of the etalon 53 to Tetln_A. This shifts the wavelength characteristics of the etalon 53. To achieve the above described shift, the temperature of the etalon needs to be variable. In addition, the temperature control range needs to be a range in which the wavelength characteristics of the etalon can change within a range of the difference between the adjoining grid wavelengths.

In this control, the controller 70 controls the wavelength of the semiconductor laser 30 so that the ratio $I_{m3}/I_{m2}$, which is the feedback control target value, is achieved in a state where the temperature of the etalon 53 is set to Tetln_A. The feedback control target value (ratio $I_{m3}/I_{m2}$) employed here is the feedback control target value associated with the channel number Ch corresponding to the reference wavelength. In addition, the initial setting values associated with the channel number Ch corresponding to the reference wavelength are also employed as other setting values for the components of the wavelength tunable laser 100.

The execution of the above described operation allows the semiconductor laser 30 to laser-oscillate at a wavelength (required wavelength) shifted from the reference wavelength (grid wavelength) by the amount of the shift of the characteristics of the etalon 53 as illustrated in FIG. 5. The method of obtaining the corresponding channel number Ch from the required wavelength is not limited to the above described method. For example, a table indicating which channel number Ch is to be selected with respect to the required wavelength may be prepared. The table stores the wavelength band corresponding to the channel number Ch, and thus the corresponding channel number may be obtained from the wavelength band corresponding to the required wavelength. In addition, the table may store the grid wavelength together with the channel number.

There may be a case where the wavelength characteristics of the etalon 53 do not regularly change or do not almost regularly change throughout the wavelength tunable band of the wavelength tunable laser 100. In such a case, there may be a case that the shift amount of the etalon characteristics (the amount of change in the etalon temperature) to obtain the required wavelength cannot be calculated with a high degree of accuracy. This is caused by the structure and the temperature characteristics of the etalon, and sometimes ignorable. However, when this significantly affects the accuracy, a fixed value cannot be used for the temperature correction factor C1, and a temperature correction factor in accordance with the required wavelength needs to be calculated. The following describes an exemplary method of obtaining the temperature correction factor by calculation.

Here, a temperature correction factor in accordance with the required wavelength is described as a temperature correction factor C2. The temperature correction factor C2 is expressed by the following equation (2).

$$C2 = A \times f + B \tag{2}$$

Figure 6:
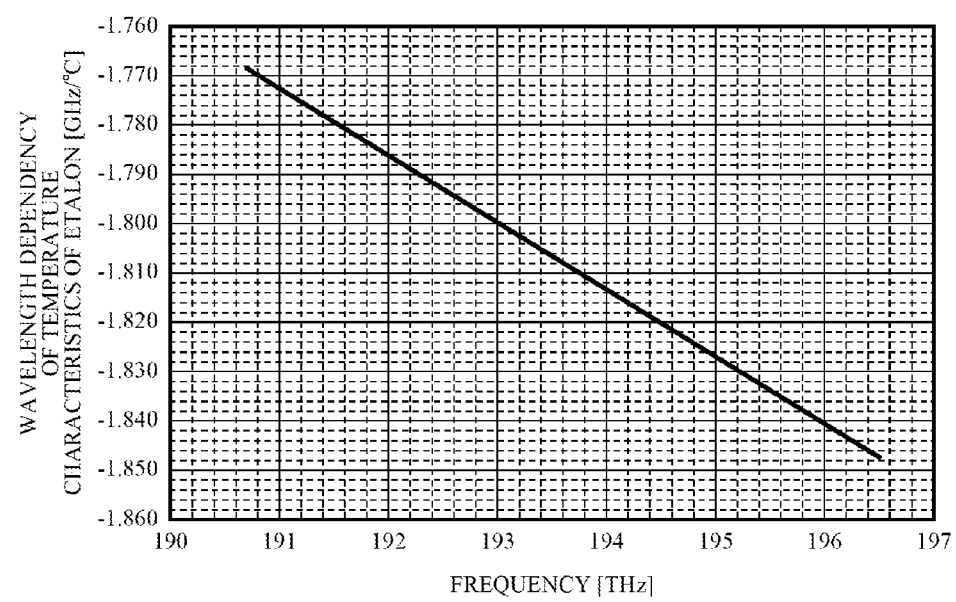
FIG. 6 is a diagram illustrating a wavelength dependency of temperature characteristics of the etalon.

FIG. 6 is a diagram illustrating wavelength dependency of the temperature characteristics of the etalon 53. The equation (2) is a linear approximate equation of the characteristics illustrated in FIG. 6 using a slope A and an intercept B. Here, the slope A is −0.0136, and the intercept B is 0.8250. The slope A and the intercept B may be stored in the data table illustrated in FIG. 7. FIG. 7 illustrates a data table storing the slope A and the intercept B instead of the temperature correction factor C1 in the data table described in FIG. 3.

In the equation (2), f is a term representing a wavelength, and may be the reference wavelength. When the reference wavelength is 196.1000 [THz], the temperature correction factor C2 is −1.840 [GHz/° C.] according to the equation (2). When the temperature correction factor C2 is given, the controller 70 calculates the setting temperature Tetln_A based on the following equation (3).

$$\text{Tetln\_A} = \text{Tetln\_B} + \Delta F/C2 \tag{3}$$

In the same manner as calculating the Tetln_A by the equation (1), when the required wavelength is 196.1070 [THz], the reference wavelength is 196.1000 [THz], Tetln_B is 40.000 [° C.], and the wavelength difference ΔF between the required wavelength and the reference wavelength is +7.0 [GHz]. Here, when the equation (3) is used instead of the equation (1), the temperature correction factor C2 is −1.840 [GHz/° C.] according to the equation (2) and Tetln_A is 36.196 [° C.]. When the wavelength tunable laser 100 is driven based on the Tetln_A obtained by the above described calculation in the same manner as the case of the equation (1), the required wavelength is achieved with a higher degree of accuracy than the case of using the equation (1).

There may be a case that a method other than the first-order approximation is appropriate to approximate the equation (2) depending on the structure and the material of the etalon. In such a case, an appropriate approximate equation is prepared as the equation (2). In addition, the required wavelength may be used for the term f of the wavelength used when calculating the equation (2) instead of the reference wavelength. The temperature correction factor C2 may be stored in the data table illustrated in FIG. 3 in association with each channel number Ch in advance instead of being calculated as described above. In this case, the values obtained from the equation (2) are preliminarily calculated, or the etalon characteristics are measured with respect to a wavelength corresponding to each channel number Ch (corresponding to the reference wavelength or the grid wavelength), and the calculated results or measured results are stored in the data table.

The above described temperature correction factor C2 can be used in a system capable of achieving the required wavelength throughout the entire area of the grid wavelength interval. However, the consideration when the temperature characteristics of the etalon depend on wavelength is not limited to the above described system.

For example, assume a system of a wavelength tunable laser that can achieve the required wavelength within only a range smaller than the grid wavelength interval. Even in this case, the use of the wavelength correction factor C2 considering the above described wavelength dependency enables to shift the characteristics of the etalon 53 with a high degree of accuracy. Needless to say, the wavelength correction factor C2 with respect to each channel number may be obtained in advance by calculation or measurements and stored in a data table instead of calculating the wavelength correction factor C2. This is useful when the characteristics of the etalon are difficult to be expressed by an approximate equation. FIG. 8 is a diagram illustrating a data table in such a case. As illustrated in FIG. 8, storing of the wavelength correction factor C2 of the etalon in association with each channel number Ch enables to control the etalon temperature with precisely reflecting the difference in etalon characteristics due to the wavelength.

Figure 9:
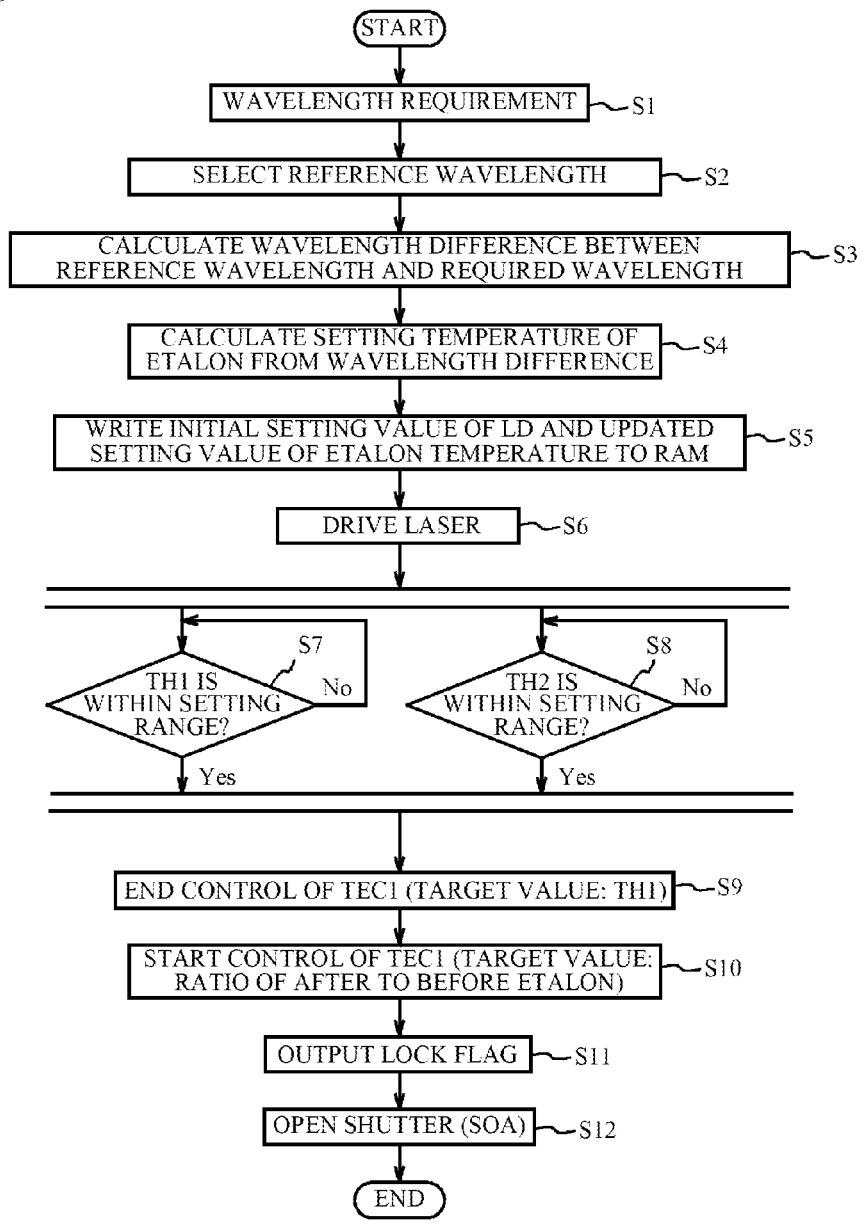
FIG. 9 is a flowchart for explaining a starting procedure to achieve a required wavelength of the semiconductor laser.

A description will next be given of a tangible method of controlling wavelength in accordance with the present embodiment with reference to a flowchart. FIG. 9 is a flowchart for explaining a starting procedure to achieve the required wavelength of the semiconductor laser 30. As illustrated in FIG. 9, the controller 70 receives a wavelength requirement (step S1). The required wavelength is input from an external input/output device not illustrated. An input/output device supporting RS232C standard is usually employed. The controller 70 then selects the reference wavelength from the grid wavelengths (step S2). The selection of the reference wavelength means selecting the grid wavelength corresponding to the channel number Ch obtained by calculation using the specified required wavelength as the reference wavelength. The grid wavelength closest to the required wavelength is selected as the reference wavelength. Selecting the grid wavelength closest to the required wavelength is an exemplary method of the selection. Alternatively, the grid wavelength closest to the required wavelength at a shorter wavelength side may be selected. Or, the grid wavelength closest to the required wavelength at a longer wavelength side may be selected. In addition, the grid wavelength closest to the required wavelength may fail to be selected as the reference wavelength. That is to say, a grid wavelength located at a position in a range in which the performance of the wavelength control of the semiconductor laser 30 is acceptable can be selected as the reference wavelength.

The controller 70 then calculates the wavelength difference ΔF between the reference wavelength and the required wavelength (step S3). The controller 70 then calculates the setting temperature Tetln_A from the wavelength difference ΔF in accordance with the above presented equation (1) (step S4). At this point, the controller 70 reads the initial temperature value $T_{Etalon}$ associated with the reference wavelength as the initial temperature Tetln_B. In addition, the temperature correction factor C1 is read from the memory 60. The setting temperature Tetln_A is calculated based on these read values and ΔF.

The controller 70 then acquires the initial setting values and the feedback control target values associated with the reference wavelength from the memory 60, and stores them in the RAM. However, the setting temperature Tetln_A calculated at step S4 is used for the control target value $T_{Etalon}$ of the second temperature control device 54 (step S5). Next, the controller 70 drives the semiconductor laser 30 based on the initial setting values and the feedback control target values determined at step S5. This makes the semiconductor laser 30 oscillate (step S6). In this case, the controller 70 drives the semiconductor laser 30 with use of the initial setting values of the reference wavelength selected at step S2, and controls the temperature of the etalon 53 to be the setting temperature Tetln_A calculated at step S4. The control of the first temperature control device 31 at this point is performed so that the temperature of the first temperature control device 31 becomes the target temperature $T_{LD}$. The SOA region A is controlled so that a light beam is not emitted from the semiconductor laser 30 at this point.

The controller 70 then determines whether a detection temperature TH1 of the first thermistor 32 is within a range of $T_{LD}$ (step S7). Here, the range of $T_{LD}$ is a predetermined range around the target temperature $T_{LD}$. When the determination at step S7 is "No", the controller 70 changes a current value supplied to the first temperature control device 31 so that the detection temperature TH1 of the first thermistor 32 comes close to the initial temperature value $T_{LD}$.

The controller 70 determines, in parallel to step S7, whether a detection temperature TH2 of the second thermistor 56 is within a setting range (step S8). The setting range in this case is determined based on the setting temperature Tetln_A. For example, the above described setting range may be a predetermined range around the setting temperature Tetln_A. When the determination at step S8 is "No", the controller 70 changes a current value supplied to the second temperature control device 54 so that the detection temperature TH2 of the second thermistor 56 comes close to the setting temperature Tetln_A.

The controller 70 waits until the determination becomes "Yes" at both step S7 and step S8. When the determination becomes "Yes" at both step S7 and step S8, ended is the temperature control of the first temperature control device 31 setting $T_{LD}$ as a control target (step S9). At this point, the semiconductor laser 30 usually oscillates at a wavelength close to the reference wavelength rather than the required wavelength.

Next, the controller 70 starts auto frequency control of the first temperature control device 31 (step S10). That is to say, the temperature of the first temperature control device 31 is feedback-controlled to satisfy the ratio $I_{m3}/I_{m2}$. The ratio of an output light beam to an input light beam of the etalon 53 (after/before ratio) represents the oscillation wavelength of the semiconductor laser 30. In addition, the first temperature control device 31 is a parameter that controls the wavelength of the semiconductor laser 30. That is to say, at step S10, the temperature of the first temperature control device 31 is feedback-controlled so that the after/before ratio becomes $I_{m3}/I_{m2}$ to control the wavelength of the semiconductor laser 30. A current value supplied to the first temperature control device 31 is controlled by a predetermined step value (fixed value). The controller 70 generates a temperature control code to make the ratio $I_{m3}/I_{m2}$ come close to the target value $I_{m3}/I_{m2}$. The temperature control code includes a code indicating temperature increase, a code indicating temperature decrease, and a code indicating that temperature change is not necessary. Performed is control to increase or decrease a current value supplied to the first temperature control device 31 by the step value based on the codes. Or, when the ratio $I_{m3}/I_{m2}$ becomes a value within a predetermined range from the target value $I_{m3}/I_{m2}$, the code indicating that temperature control is unnecessary is output from the controller 70, and the amount of current of the first temperature control device 31 is not changed. As previously described, the temperature of the etalon 53 has been changed to the value calculated at step S4, and thus the oscillation wavelength of the semiconductor laser 30 becomes not the reference wavelength but the required wavelength by performing the feedback control of which the feedback control target value is the ratio $I_{m3}/I_{m2}$ associated with the reference wavelength.

The controller 70 outputs a lock flag when determining that the ratio $I_{m3}/I_{m2}$ is within a predetermined range around the target value $I_{m3}/I_{m2}$ associated with the reference wavelength selected at step S2 (step S11). When the lock flag is output, the controller 70 opens a shutter (step S12). More specifically, the controller 70 controls the electric current supplied to the electrode 21 of the SOA region C to have the initial current value $I_{SOA}$. This makes the semiconductor laser 30 emit a laser beam with the required wavelength. After the shutter is opened, the drive current of the SOA region C is feedback-controlled based on the detection result of the output detecting unit 40 so that $I_{SOA}$ remains a predetermined value.

When a required wavelength different from the wavelength at the start should be achieved after starting the semiconductor laser 30, the SOA region C is first controlled to close the shutter. Then, the above described starting procedure is performed from step S1.

The present embodiment can achieve a wavelength (required wavelength) other than the grid wavelengths, and thus can prevent the increase in amount of the data to be stored in the memory 60. The present embodiment uses the ratio $I_{m3}/I_{m2}$, which is determined to achieve the reference wavelength (grid wavelength), as the feedback control target value for the target wavelength without modifying it. The present embodiment does not modify the ratio $I_{m3}/I_{m2}$ that is the feedback control target value to control the wavelength, and only shifts the wavelength characteristics of the etalon 53 to achieve the required wavelength. Thus, the error included in the required wavelength achieved by the present embodiment becomes within the sum of the wavelength error when the reference wavelength (grid wavelength) is achieved and the error of the shift amount of the wavelength characteristics of the etalon 53. That is to say, when the shift amount of the wavelength characteristics of the etalon 53 is sufficiently controlled, the error to achieve the required wavelength can be made to be close to approximately the error of the reference wavelength (grid wavelength). The grid wavelengths are tuned before shipment with use of a highly accurate wavemeter, and thus the error is very small. The present embodiment can make the error close to the error of the grid wavelength even though the parameters to achieve the required wavelength are calculated.

The present embodiment uses a solid etalon as the etalon 53, but may use other etalons. For example, a crystal etalon including a crystal layer between mirrors may be used as the etalon 53. In this case, wavelength characteristics of the crystal etalon can be shifted by controlling a voltage applied to the crystal. In addition, an air gap etalon capable of changing a gap length between mirrors in accordance with an applied voltage may be used as the etalon 53. In this case, the control of the applied voltage enables to shift the wavelength characteristics of the air gap etalon. In any of the crystal etalon and the air gap etalon, the temperature control is performed by the second temperature control device 54. However, the temperature control in this case is not for shifting the wavelength characteristics, but is for preventing the variation of the wavelength characteristics due to the temperature. Thus, the temperature is controlled to be constant. When the crystal etalon or the air gap etalon is employed, the control value of the etalon temperature is not calculated based on the wavelength difference $\Delta F$, and a target value to control the wavelength characteristics of the crystal etalon or the air gap etalon is calculated based on the wavelength difference $\Delta F$ at step S4.

Second Embodiment

The semiconductor laser 30 illustrated in FIG. 2 includes wavelength selective elements with different periodical peak intervals of wavelength characteristics. This type of semiconductor laser utilizes a fact that these wavelength selective elements have different periodical wavelength characteristics to select a specific wavelength with use of vernier effect. In the semiconductor laser 30 illustrated in FIG. 2, the SG-DFB region A and the CSG-DBR region B correspond to the above described wavelength selective elements. The SG-DFB region A and the CSG-DBR region B have a periodical peak in the wavelength characteristics. The peak periods of the wavelength characteristics differ from each other. The vernier effect using the difference enables to select a specific oscillation wavelength.

The semiconductor laser 30 illustrated in FIG. 2 integrates the SG-DFB region A and the CSG-DBR region B that are wavelength selective elements in a single semiconductor chip. As described in the flowchart of FIG. 9, to achieve the required wavelength, the temperature of the first temperature control device 31 (TEC1) is controlled at step S10. When the temperature of the semiconductor laser 30 is changed, the wavelength characteristics of the SG-DFB region A and the CSG-DBR region B change. The change of the wavelength characteristics depends to a large extent on the change of the semiconductor characteristics such as a refractive index with respect to the change in temperature. The change of the wavelength characteristics affects both the absolute value of a peak wavelength and an interval between the peak wavelengths (peak wavelength period). That is to say, the change of the temperature of the semiconductor laser 30 changes one or both of the interval between the peak wavelengths (wavelength difference) and the absolute value of the peak wavelength in each of the SG-DFB region A and the CSG-DBR region B. Here, the change of the temperature of the semiconductor laser 30 can monotonically shift the selected wavelength with use of vernier effect when the amount of change in the interval between the peak wavelengths with respect to the temperature change in the SG-DFB region A is similar to that in the CSG-DBR region B and the amount of change in the absolute value of the peak wavelength is small. In this case, the required wavelength shifting from the reference wavelength by the wavelength difference $\Delta F$ can be achieved by only controlling the temperature of the semiconductor laser.

However, there may be a problem when the difference in the amount of change in the interval between the peak wavelengths with respect to the temperature change of the semiconductor laser 30 is large between the SG-DFB region A and the CSG-DBR region B, or the difference in the amount of change in the absolute value of the peak wavelength is large, or both holds. In such a case, if the temperature of the semiconductor laser 30 is changed, the overlap of the wavelength characteristics due to the vernier effect may disappear. Or, the overlap due to the vernier effect occurs at a completely different wavelength. In any of the cases, the wavelength control of the semiconductor laser 30 fails. The design or the production tolerance of the semiconductor laser 30 greatly affects the occurrence of the above described problem.

When the above described problem occurs, wavelength characteristics of the wavelength selective elements (the SG-DFB region A and the CSG-DBR region B) may be controlled, at the same time as the temperature of the semiconductor laser 30 is controlled, by a method other than the method using the temperature of the semiconductor laser 30 so that the wavelength control does not fail. The present embodiment controls the wavelength characteristics of the CSG-DBR region B by the heater 10 to prevent the fail of the wavelength control. The flowchart for the control in accordance with the present embodiment is the same as the one illustrated in FIG. 9 described in the first embodiment, and the same control as the first embodiment is performed when the description is not particularly given.

The first embodiment changes a current value supplied to the first temperature control device 31 based on the code and the step value when the determination at step S10 in FIG. 9 is "No". The present embodiment corrects electric power supplied to the heater 10 in addition to the above operation. The semiconductor laser 30 in FIG. 2 includes three heaters 10. The starting electric power of the heaters 10 have the initial electric power values $P_{Heater1}$ to $P_{Heater3}$. The present embodiment corrects the initial electric power values $P_{Heater1}$ to $P_{Heater3}$. The current value supplied to the first temperature control device 31 changes by the above described step value, and thus the electric power of the heater 10 can be corrected by a fixed value in accordance with the step value. The temperature of the semiconductor laser 30 is changed by the above described step value while the electric power value of the heater 10 is fixed, and then the output wavelength characteristics that degrade at that time are obtained to determine the fixed value to control the heater 10. The correction amount of the heater 10 necessary to improve the degradation of the output wavelength characteristics (e.g. expansion of a wavelength line width) is obtained, and set as the fixed value to control the heater 10. The fixed value obtained as described above is stored in the memory. The controller 70 reads the fixed value from the memory, and corrects the supplied electric power to the heater 10 based on the fixed value at the same time as changing the current value of the first temperature control device 31 at step S10. Although a code indicating temperature increase or decrease is necessary to correct the supplied electric power to the heater 10, the code to control the first temperature control device 31 (first embodiment) may be used. For example, when the code to raise the temperature of the first temperature control device 31 is given and the correction to raise the temperature of the CSG-DBR region B is performed, the temperature control of the heater 10 may be performed using the code to control the first temperature control device 31 without modifying it. The semiconductor laser 30 illustrated in FIG. 2 includes three heaters 10. The present embodiment shifts the temperatures of the three heaters 10 by the same amount by correcting the initial electric power values $P_{Heater1}$ to $P_{Heater3}$ of the respective heaters 10. The values indicating the shift amounts to correct the initial electric power values $P_{Heater1}$ to $P_{Heater3}$ in the present embodiment also correspond to a rate of change of wavelength of the drive condition. The present embodiment can prevent the fail of the wavelength control by controlling the temperature of the semiconductor laser 30.

Third Embodiment

Figure 10:
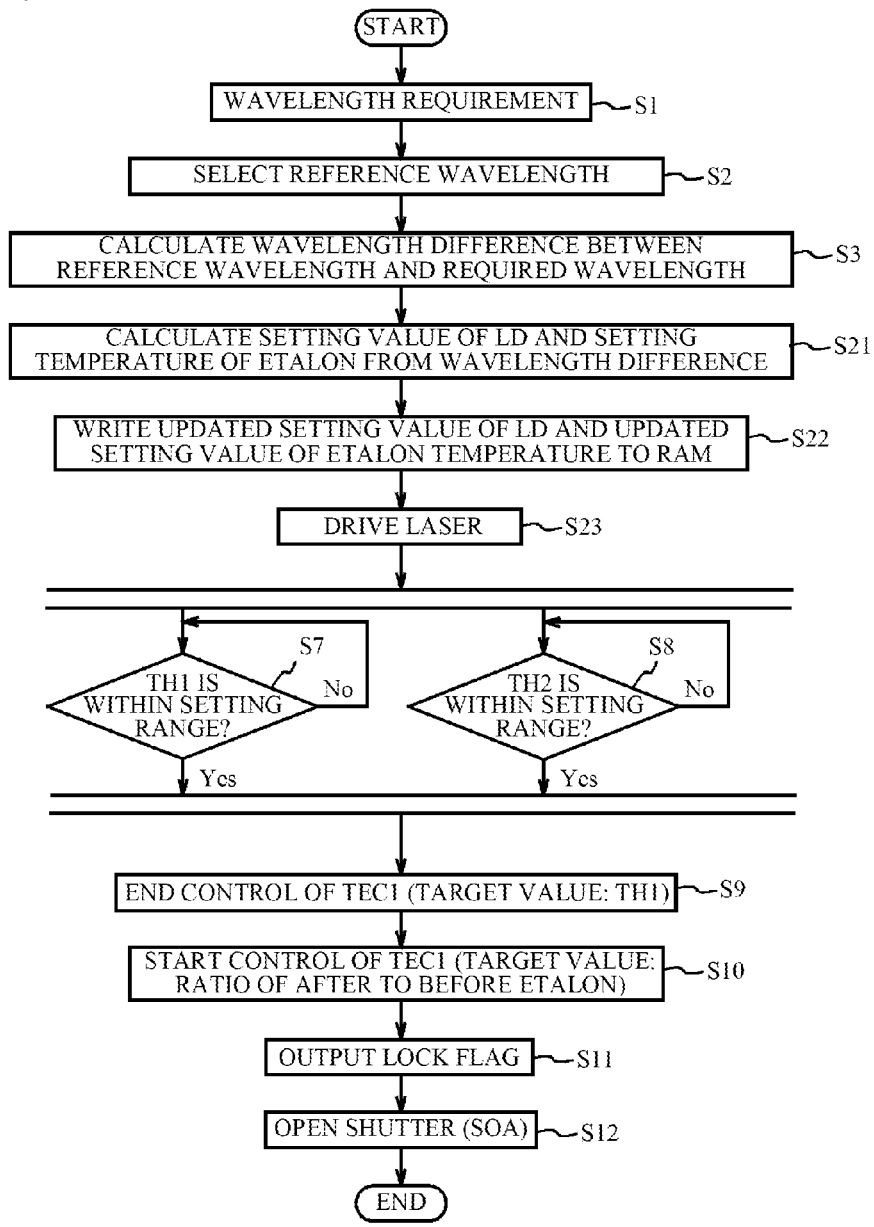
FIG. 10 is a flowchart for control in accordance with a third embodiment.

As described in the flowchart of FIG. 9, only the setting temperature Tetln_A is calculated based on the wavelength difference ΔF between the reference wavelength and the required wavelength in the first embodiment. However, calculation to change other parameters may be additionally performed. FIG. 10 is a flowchart for control in accordance with the present embodiment. In FIG. 10, the same step numbers of FIG. 9 are affixed to the steps same as those of the first embodiment, and the description thereof is omitted.

In the present embodiment, the ratio of the amount of change in the temperature to the amount of change in the oscillation wavelength of the semiconductor laser 30 is preliminarily determined as the temperature correction factor C2. At step S21 in FIG. 10, the initial temperature value $T_{LD}$ with which the semiconductor laser 30 oscillates at the required wavelength is calculated from the wavelength difference ΔF with use of the temperature correction factor C2. That is to say, the temperature correction factor C2 also corresponds to the rate of change of wavelength of the drive condition.

At the same time, in the same manner as step S4 in FIG. 9, the setting temperature Tetln_A is calculated from the wavelength difference ΔF. Next, at step S22, the initial temperature value $T_{LD}$ and the setting temperature Tetln_A, and the feedback control target values are stored in the RAM. Then, at step S23, the semiconductor laser 30 is driven based on the initial temperature value $T_{LD}$ and the setting temperature Tetln_A determined at step S22, and the feedback control target values. The steps thereafter are the same as those in the first embodiment, and the description thereof is omitted.

The present embodiment sets the temperature of the semiconductor laser to a value close to the temperature to achieve the required wavelength. This enables to shorten the loop period required to achieve the target ratio of after to before the etalon 53, i.e. the ratio $I_{m3}/I_{m2}$, at step S10 in FIG. 10. When a wavelength other than the grid wavelength closest to the required wavelength is selected as the reference wavelength, the required wavelength is reliably achieved by performing the present embodiment.

Fourth Embodiment

In the flowchart of FIG. 9 in the first embodiment, the temperature of the etalon 53 is set to the temperature Tetln_A calculated at step S4 when the wavelength tunable laser 100 is driven (step S6). The present embodiment first drives the wavelength tunable laser 100 with the setting temperature ($T_{etalon}$) of the etalon 53 associated with the reference wavelength to make the semiconductor laser 30 oscillate at the reference wavelength, and then makes the semiconductor laser 30 oscillate at the required wavelength.

Figure 11:
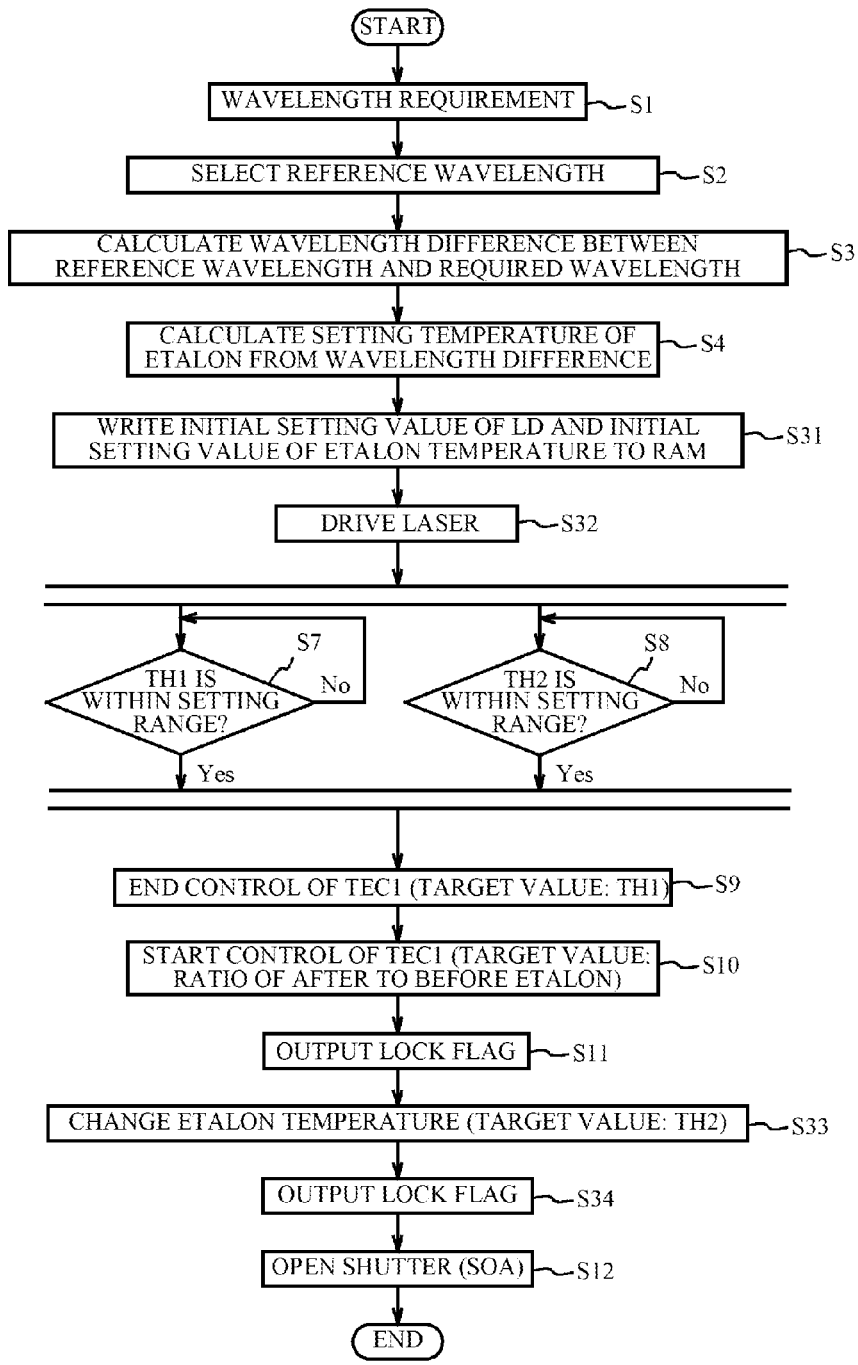
FIG. 11 is a flowchart in accordance with a fourth embodiment.

FIG. 11 is a flowchart in accordance with the present embodiment. In FIG. 11, the same step numbers are affixed to the steps same as those in the first embodiment, and the description thereof is omitted. The controller 70 first executes step S1 to step S4 in FIG. 11. The executed processes in these steps are the same as those in the first embodiment.

Next, the controller 70 reads the initial setting values associated with the reference wavelength selected at step S2 from the memory 60, and stores them in the embedded RAM (step S31). Next, the controller 70 drives the semiconductor laser 30, the first temperature control device 31, and the second temperature control device 54 based on the contents in the RAM (step S32).

The controller 70 then executes step S7 to step S11. The control at step S7 to step S11 is the same as that in the first embodiment, and the description thereof is omitted. The initial setting values associated with the reference wavelength are set in the RAM of the controller 70 at step S32, and thus the semiconductor laser 30 oscillates at the wavelength selected at step S2 (reference wavelength) at the time when the lock flag is output at step S11.

Then, the present embodiment changes the temperature control target value TH2 of the second temperature control device 54 to the setting temperature Tetln_A calculated at step S4. This shifts the wavelength characteristics of the etalon 53 by ΔF calculated at step S3 (step S33). Step S33 changes the wavelength characteristics of the etalon 53, and this makes the ratio of after to before the etalon 53, which became a value within a setting range at step S11, move outside the setting range again. On the other hand, the auto frequency control of the first temperature control device 31 started at the step S10 is continued during the above described process. Thus, the ratio of after to before the etalon 53 gradually returns to a value within the setting range.

After that, the controller 70 outputs a lock flag again (step S34) when determining that the temperature of the etalon 53 reaches the setting temperature Tetln_A and the ratio $I_{m3}/I_{m2}$ is within a predetermined range around the target value $I_{m3}/I_{m2}$ in the reference wavelength selected at step S2. When the lock flag at step S34 is output, the controller 70 opens a shutter (step S12).

The present embodiment once locks the oscillation wavelength to the reference wavelength and then changes the temperature of the etalon 53, and thus can reliably obtain the required wavelength. In addition, the required wavelength can be achieved based on any of the grid wavelengths as the first embodiment can, and thus the increase in the amount of data to be stored in the memory 60 can be prevented.

Fifth Embodiment

Figure 12:
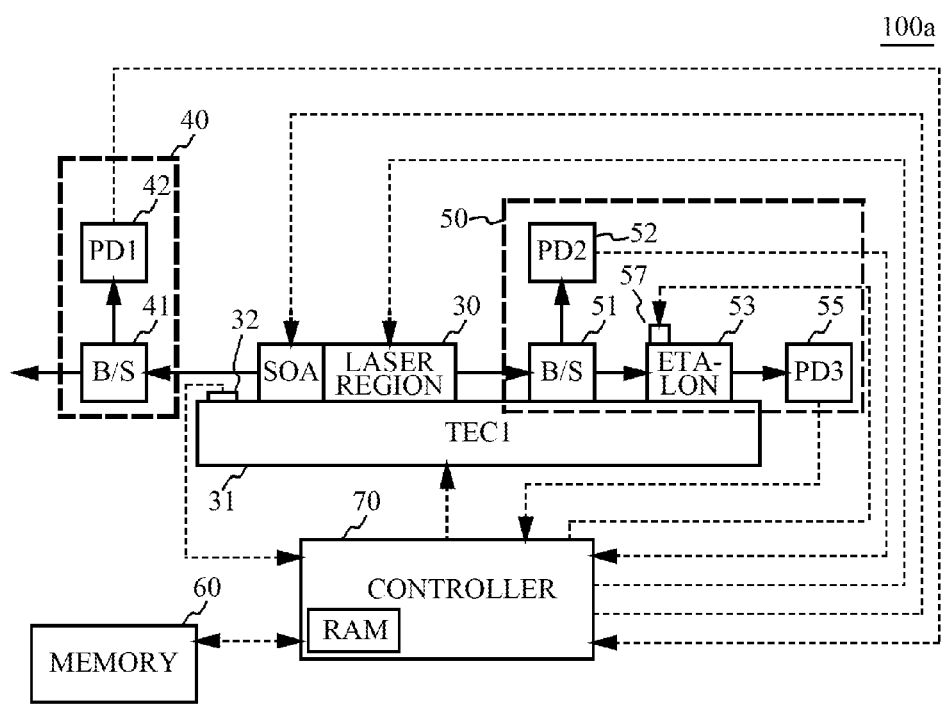
FIG. 12 is a diagram illustrating a wavelength tunable laser including a semiconductor laser and an etalon mounted on a single temperature control device.

The first through fourth embodiments mount the semiconductor laser 30 and the etalon 53 on different temperature control devices. However, the present invention can be applied to a case where they are mounted on a single temperature control device. FIG. 12 is a diagram illustrating a wavelength tunable laser 100a including the semiconductor laser 30 and the etalon 53 mounted on a single temperature control device 31. Here, the semiconductor laser 30 is a semiconductor optical amplifier when it is an external resonator laser described later. The semiconductor laser 30 and the semiconductor optical amplifier may be collectively described as a semiconductor gain element.

In FIG. 12, the same reference numerals are affixed to the components same as those of FIG. 1, and the description thereof is omitted. The wavelength tunable laser 100a of the present embodiment includes a heater 57 near the etalon 53 to control the temperature of the etalon 53 to be a value different from the temperature of the temperature control device 31. That is to say, the present embodiment controls the wavelength characteristics of the etalon 53 by the heater 57. The etalon 53 is held by an etalon holder (not illustrated). The heater 57 may be attached to the etalon holder. The heater 57 is usually a Ni heater using a metal material as a heating element. Needles to say, the position in which the heater 57 is located is arbitrary as long as the temperature of the etalon 53 can be controlled.

The wavelength tunable laser 100a configured as illustrated in FIG. 12 can basically employ the control flow described in the first through fourth embodiment for the control to achieve the required wavelength. However, the present embodiment controls the wavelength characteristics of the etalon 53 by the heater 57, and thus the memory 60 stores the initial value of the heater 57 determined with respect to each grid wavelength instead of the initial temperature value $T_{Etalon}$ of the second temperature control device 54. Further, the memory 60 stores a ratio of a shift amount of the wavelength characteristics of the etalon 53 to a change in temperature of the heater 57 as the temperature correction factor C1.

The present embodiment calculates a control value of the generating heat of the heater 57 based on ΔF at step S4, at which the setting temperature of the etalon 53 is calculated based on ΔF in the first through fourth embodiments. In this case, the control value of the heater 57 to achieve the required wavelength is calculated with use of the initial value of the heater 57 associated with the reference wavelength selected at step S2, ΔF, and the ratio C1 of the shift amount of the wavelength characteristics of the etalon 53 to the change in temperature of the heater 57.

The control value of the heater 57 to achieve the required wavelength is normally obtained by calculating the amount of electrical power input to the heater 57. In addition, the input electric power of the heater 57 may be feedback-controlled by measuring the temperature of the etalon 53 by a temperature detection element (not illustrated) such as a thermistor located near the etalon 53 and using it. In addition, the control value of the heater 57 is changed to the control value calculated based on ΔF instead of changing the temperature of the second temperature control device 54 to the setting temperature calculated at step S4 in the control performed in the first through fourth embodiments.

The execution of the above described control enables to apply the present invention to a case where the semiconductor laser 30 and the etalon 53 are mounted on a single temperature control device. The present embodiment controls the wavelength characteristics of the etalon 53 by the heater 57, but does not intend to suggest any limitation. For example, a crystal etalon may be used as the etalon 53. In this case, instead of the control of the heater 57 of the present embodiment, a voltage applied to a crystal portion of the crystal etalon may be controlled. In addition, an air gap etalon may be used as the etalon 53. In this case, instead of the control of the heater 57 of the present embodiment, a gap amount of the air gap etalon may be controlled. The present embodiment includes only one temperature control device, and thus can reduce the electric power consumption.

Sixth Embodiment

Figure 13:
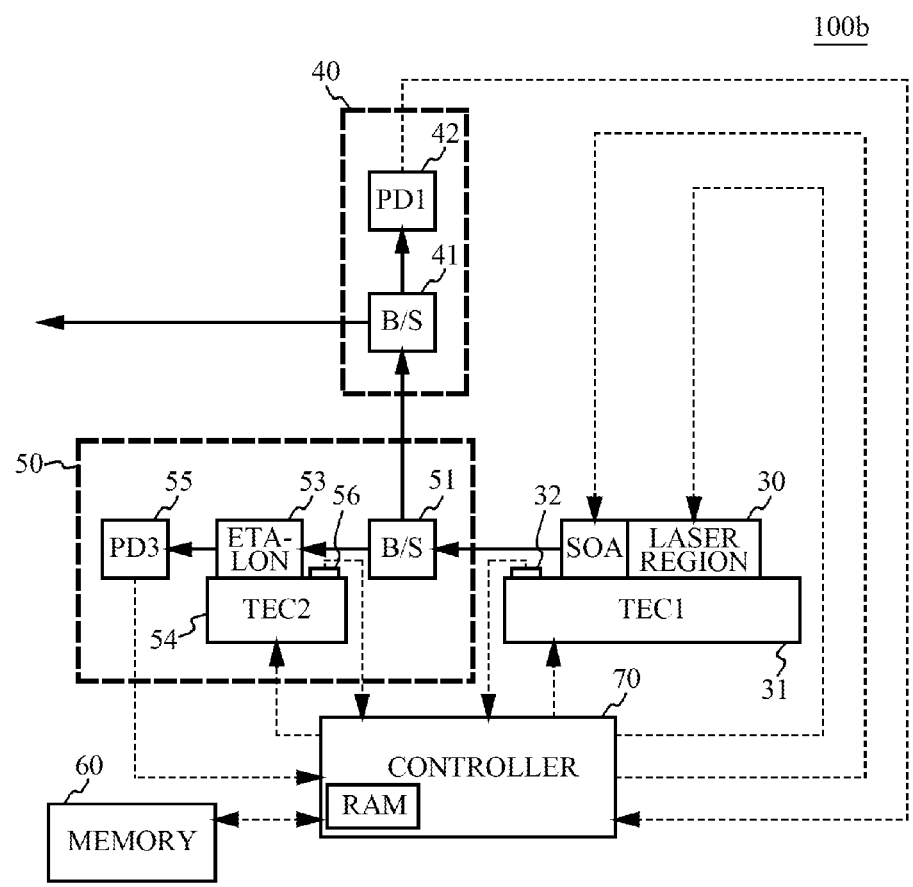
FIG. 13 is a block diagram illustrating an overall configuration of a wavelength tunable laser in accordance with a sixth embodiment.

FIG. 13 is a block diagram illustrating an overall configuration of a wavelength tunable laser 100b in accordance with a sixth embodiment. As illustrated in FIG. 13, the wavelength tunable laser 100b includes the output detecting unit 40 and the wavelength locker unit 50 both located at the front side of the semiconductor laser 30, and may be called as a front locker type. In contrast, the wavelength tunable laser described in FIG. 1 may be called as a rear locker type. In a case of the front locker type, the second light receiving element 52, which is employed in the rear locker type, is not provided. This is because the first light receiving element 42 can also function as the second light receiving element.

In the wavelength tunable laser 100b, the beam splitter 51 is located at a position where it can split a light beam emitted from the front of the semiconductor laser 30. The etalon 53 is located at a position where it can transmit a first light beam of two light beams split by the beam splitter 51. The third light receiving element 55 is located at a position where it can receive the transmitted light beam transmitted through the etalon 53. The beam splitter 41 is located at a position where it can split a second light beam of the two light beams split by the beam splitter 51. The first light receiving element 42 is located at a position where it can receive a first light beam of two light beams split by the beam splitter 41.

In the present embodiment, the output optical intensity of the semiconductor laser 30 can be detected with the photocurrent value $I_{m1}$ output by the first light receiving element 42. Obtained is a ratio $I_{m3}/I_{m1}$ (before/after ratio), which is a ratio of the photocurrent value $I_{m3}$ output from the third light receiving element 55 to the photocurrent value $I_{m1}$ output from the first light receiving element 42, by receiving a light beam that is not transmitted through the etalon 53 out of the light beams emitted from the front of the semiconductor laser 30 by the first light receiving element 42 and receiving a light beam transmitted through the etalon 53 by the third light receiving element 55. The use of the before/after ratio enables to detect the output wavelength of the semiconductor laser 30.

As described above, the wavelength control same as that in the wavelength tunable laser 100 configured as illustrated in FIG. 1 can be achieved even though both the output detecting unit 40 and the wavelength locker unit 50 are located at the front side of the semiconductor laser 30 as illustrated in FIG. 13.

Figure 14:
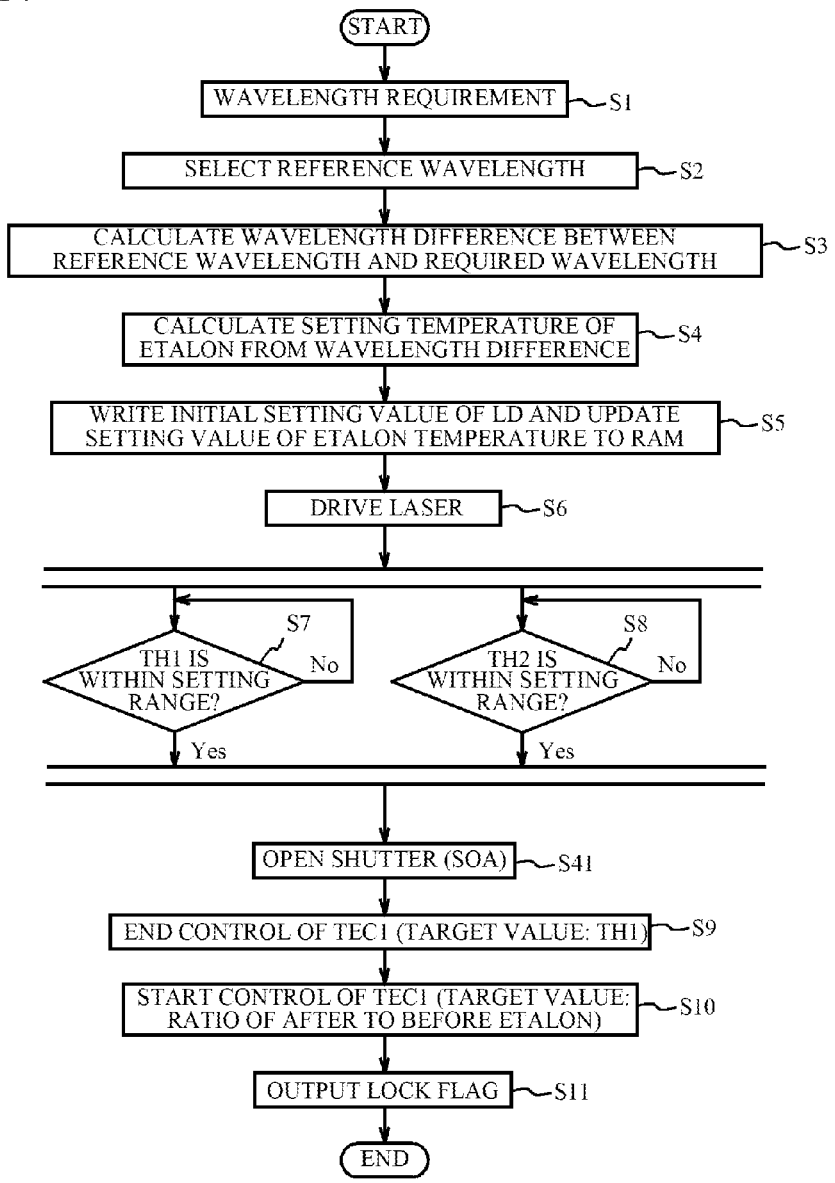
FIG. 14 is a flowchart illustrating control at the time of starting a semiconductor laser in accordance with the sixth embodiment.

FIG. 14 is an exemplary flowchart in accordance with control at the time of starting the semiconductor laser 30 in accordance with the present embodiment. In the flowchart, the same step numbers are affixed to the steps at which the same control as the first embodiment is performed, and the description thereof is omitted. In the present embodiment, the first light receiving element 42 additionally has the function of the second light receiving element 52 in FIG. 1. Therefore, the control referring to the output of the second light receiving element in the first embodiment may be performed by referring to the output of the first light receiving element 42 in the present embodiment.

The controller 70 first executes steps S1 to S8 in the first embodiment. When the temperature TH1 of the first thermistor 32 reaches a value within the setting range and the determination becomes "Yes" at step S7, and the temperature TH2 of the second thermistor 56 reaches a value within the setting range and the determination becomes "Yes" at step S8, a drive current is supplied to the SOA of the semiconductor laser 30, and an output light beam is emitted from the semiconductor laser 30. This corresponds to opening a shutter (step S41).

When the shutter is opened at step S41, ended is the control of the first temperature control device 31 that sets the initial temperature $T_{LD}$ as the target value of the output value TH1 of the first thermistor 32 (step S9). The temperature control of the first temperature control device 31 referring to the ratio of after to before the etalon 53 is started at the same time as the execution of step S9 (step S10). The present embodiment uses the ratio $I_{m3}/I_{m1}$, which is a ratio of the photocurrent $I_{m3}$ output from the third light receiving element 55 to the photocurrent $I_{m1}$ output from the first light receiving element 42, as the ratio of after to before the etalon 53. Therefore, the memory 60 stores $I_{m3}/I_{m1}$ as the feedback control target value instead of $I_{m3}/I_{m2}$. The execution of step S4 to step S6 changes the temperature of the second temperature control device 54 to the initial setting value $T_{etaron}$ determined with respect to the reference wavelength. Thus, the wavelength characteristics of the etalon 53 have been changed to the wavelength characteristics with which the required wavelength is achieved when the feedback control of which the target value is the after/before ratio associated with the reference wavelength is performed. Therefore, the control to obtain the oscillation at the required wavelength is performed by executing the feedback control at step S10 of which the target value is the after/before ratio associated with the reference wavelength selected at step S2.

When detecting that the ratio of after to before the etalon 53 reaches a value within a predetermined range around the after/before ratio associated with the reference wavelength selected at step S2, the controller 70 outputs a lock flag (step S11). The output of the lock flag from the controller 70 achieves a state capable of communication, and a starting sequence of the wavelength tunable laser ends. The end of the starting sequence is the same as that in the first through fourth embodiments.

The wavelength tunable laser of a front locker type employed in the present embodiment opens a shutter (step S41) in a state before the lock flag is output. However, the wavelength characteristics of the etalon 53 have reached the wavelength characteristics with which the required wavelength is achieved at this point when the feedback control of which the target value is the after/before ratio associated with the reference wavelength is performed. Therefore, the required wavelength is rapidly output after the shutter is opened. This has an advantage in reducing the time period during which an output at a wavelength other than the required wavelength is performed after the shutter is opened.

In the execution of the present embodiment, the drive current of the SOA may be decreased when opening the SOA, which functions as a shutter, at step S41. The drive current of the SOA is changed to the regular output value after the lock flag is output at step S11. This method can prevent the optical output with a wavelength other than the required wavelength from adversely affecting the outside because the optical output is small till the oscillation wavelength is locked to the required wavelength.

Seventh Embodiment

The sixth embodiment controls the temperature of the first temperature control device 31 to be the initial setting value $T_{LD}$ associated with the reference wavelength before a shutter is opened. Thus, the semiconductor laser 30 tends to oscillate at a wavelength close to the reference wavelength immediately after the shutter is opened. To obtain the required wavelength more rapidly than the sixth embodiment, an operation to make the temperature of the first temperature control device 31 close to the temperature achieving the required wavelength may be performed before the shutter is opened. The operation for this is based on the principle same as that in the third embodiment.

Figure 15:
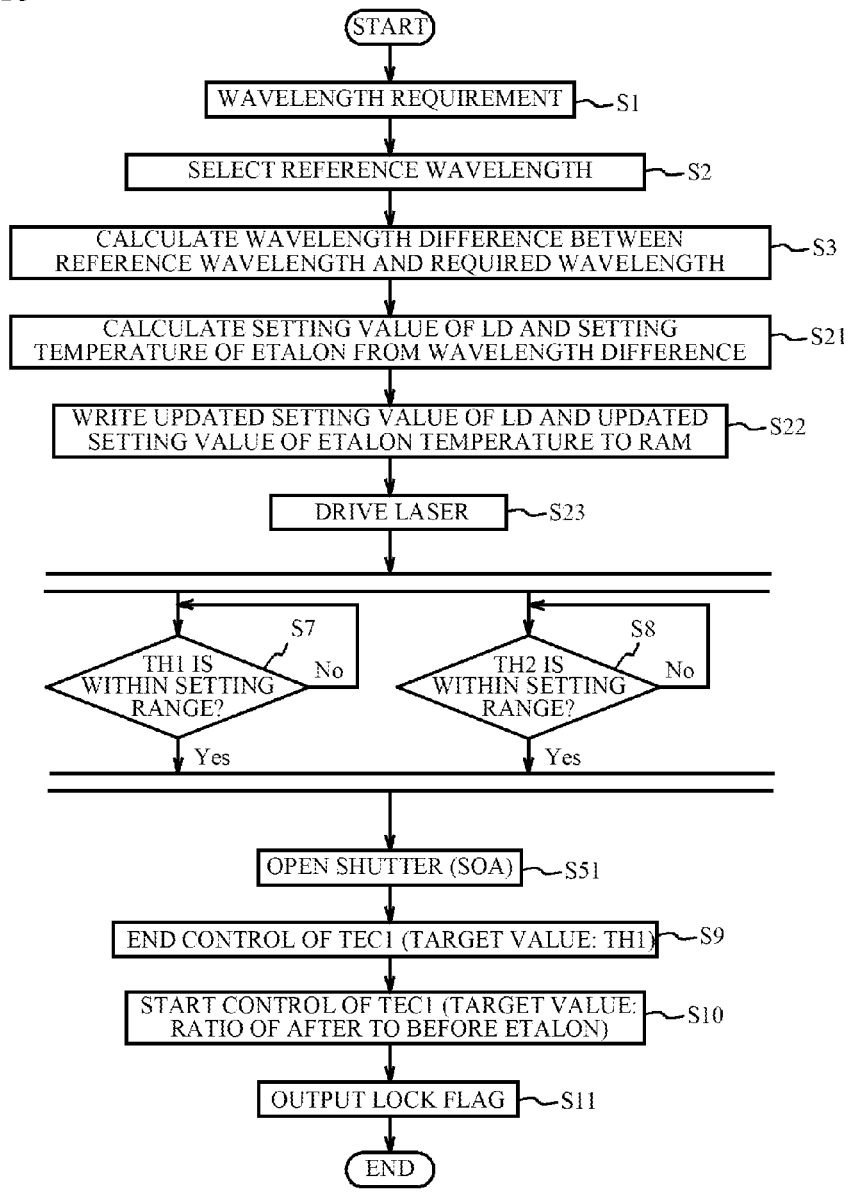
FIG. 15 is a flowchart for explaining the operation of a seventh embodiment.

The present embodiment calculates the operating condition of the semiconductor laser 30 and adopts it to the semiconductor laser 30 in the same manner as the third embodiment in the front locker type described in FIG. 13. FIG. 15 is a flowchart for explaining an operation of the present embodiment. The present embodiment uses the same control principle as the third embodiment, and the same step numbers are affixed to the steps same as those in the third embodiment, and the description thereof is omitted.

As illustrated in FIG. 15, the present embodiment executes step S1 to step S8. The present embodiment uses the temperature of the first temperature control device 31 as the setting value of the semiconductor laser 30 that is used in calculating the setting value of the semiconductor laser 30 (step S21), wiring into the RAM (step S22), and driving the semiconductor laser 30 (step S23). Examples of the setting value of the semiconductor laser 30 include a drive current input to the semiconductor laser and a condition of heater control electric power.

Execution of step S1 to step S8 of the present embodiment is the same as that in the third embodiment. When the temperature TH1 of the first thermistor 32 reaches a value within the setting range and the determination becomes "Yes" at step S7 and the temperature TH2 of the second thermistor 56 reaches a value within the setting range and the determination becomes "Yes" at step S8, a drive current is supplied to the SOA of the semiconductor laser 30, and an output light beam is emitted from the semiconductor laser 30. This corresponds to opening a shutter (step S51).

When the shutter is opened at step S51, ended is the control of the first temperature control device 31 that sets the setting value calculated at step S21 as the target value of the output value TH1 of the first thermistor 32 (step S9). The temperature control of the first temperature control device 31 referring to the ratio of after to before the etalon 53 is started at the same time as the execution of step S9 (step S10). The present embodiment uses the ratio $I_{m3}/I_{m1}$, which is a ratio of the photocurrent $I_{m3}$ output from the third light receiving element 55 to the photocurrent $I_{m1}$ output from the first light receiving element 42, as the ratio of after to before the etalon 53. Thus, the memory 60 stores $I_{m3}/I_{m1}$ as the feedback control target value. The execution of step S4 to step S6 has changed the temperature of the second temperature control device 54 from the initial setting value $T_{etaron}$ determined with respect to the reference wavelength. Therefore, the wavelength characteristics of the etalon 53 have been changed to the wavelength characteristics with which the required wavelength is achieved when the feedback control of which the target value is the after/before ratio associated with the reference wavelength is performed. Thus, when the feedback control of which the target value is the after/before ratio associated with the reference wavelength selected at step S2 is executed at step S10, the control to obtain the oscillation at the required wavelength is achieved. At this time, in the present embodiment, the temperature of the first temperature control device 31 has reached the setting value calculated at step S21, and thus the required wavelength is rapidly achieved.

After that, when detecting that the ratio of after to before the etalon 53 reaches a value within a predetermined range around the after/before ratio associated with the reference wavelength selected at step S2, the controller 70 outputs a lock flag (step S11). The output of the lock flag from the controller 70 achieves a state capable of communication, and the starting sequence of the wavelength tunable laser ends. The present embodiment enables to achieve the required wavelength rapidly. The present embodiment may also decrease the output of the SOA till the lock flag is output at step S11 as the seventh embodiment dose.

Eighth Embodiment

Figure 16:
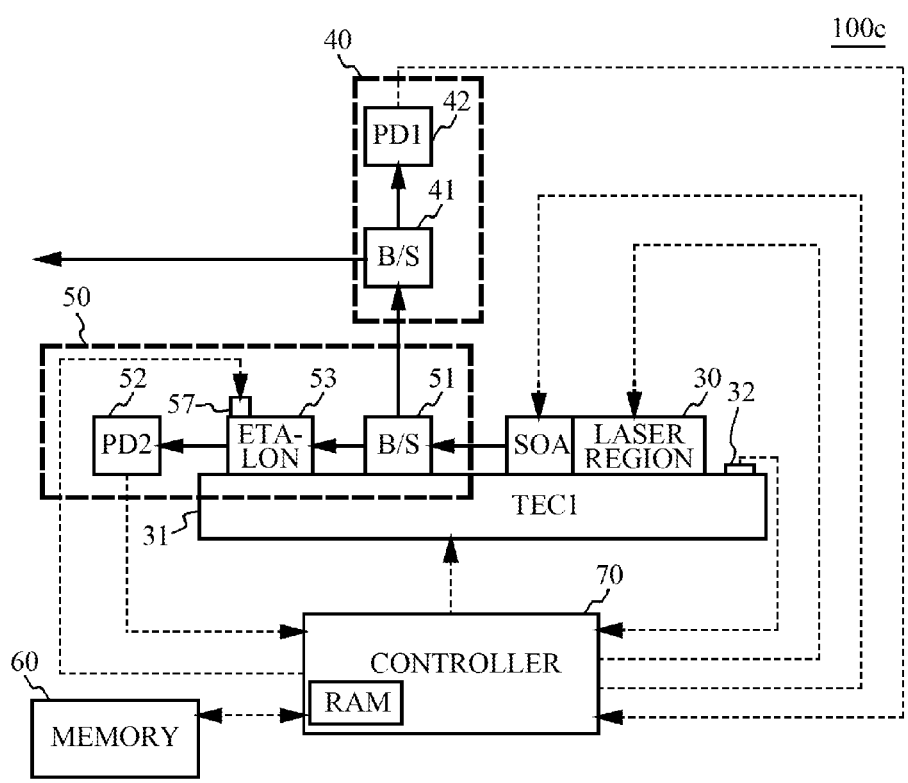
FIG. 16 is a diagram explaining a configuration of an alternative wavelength tunable laser of a front locker type.

FIG. 16 is a diagram for explaining another configuration of a wavelength tunable laser 100c of a front locker type. The wavelength tunable laser 100c illustrated in FIG. 16 includes the semiconductor laser 30 and the etalon 53 located on the first temperature control device 31. This configuration is the same as that of the wavelength tunable laser 100a described in FIG. 12, and other structures and the control operation to achieve the required wavelength are the same as those of the fifth embodiment except that the wavelength tunable laser 100c is of a front locker type, and thus the description thereof is omitted. Needless to say, the wavelength tunable laser 100c is of a front locker type, and thus the second light receiving element 52 employed in FIG. 12 is eliminated, and the output of the first light receiving element 42 substitutes for the output thereof. This point is the same as that of the seventh embodiment.

Ninth Embodiment

Figure 17:
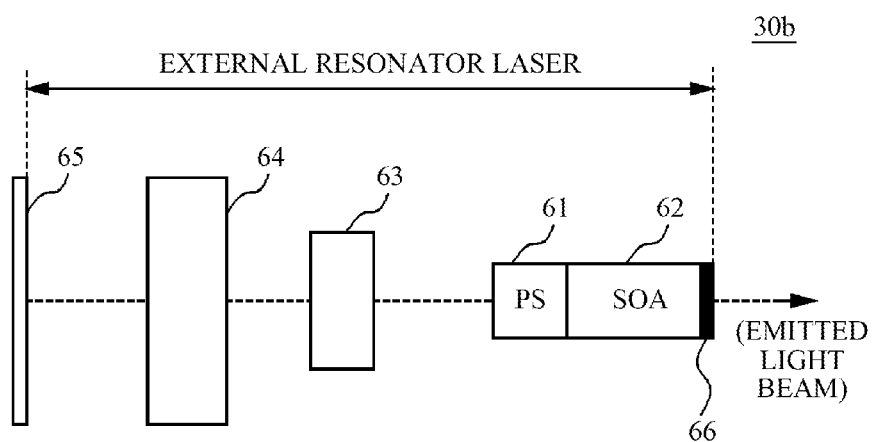
FIG. 17 discloses an example of a laser device that can be used in place of a semiconductor laser.

FIG. 17 discloses an example of a laser device that can be used in place of the semiconductor laser 30. FIG. 17 is a diagram illustrating a laser module including an external resonator. As illustrated in FIG. 17, a laser module 30b includes a semiconductor optical amplifier 62 with which a phase shifter 61 is integrated, a lens 63, a wavelength selective unit 64, and a mirror 65. The lens 63, the wavelength selective unit 64, and the mirror 65 are located at the back of the semiconductor optical amplifier 62 in this order from the semiconductor optical amplifier 62 side. A mirror 66 is located at the front of the semiconductor optical amplifier 62.

A light beam emitted from the back of the semiconductor optical amplifier 62 enters the wavelength selective unit 64. The wavelength selective unit 64 normally has a structure of an etalon. A solid etalon capable of controlling temperature or a wavelength characteristic tunable etalon such as a crystal etalon and an air gap etalon may be used as the wavelength selective unit 64. Or, a unit combining the tunable etalon and a separate wavelength selective unit that is a tunable etalon with different wavelength characteristics may be used. A light beam with a wavelength selected by the wavelength selective unit 64 is amplified by the semiconductor optical amplifier 62 and resonates between the mirror 65 and the mirror 66 to oscillate at a predetermined wavelength. The wavelength selective unit 64 is controlled to change the wavelength. A phase shift amount of the phase shifter 61 is adjusted as needed. The laser module illustrated in FIG. 17 may be used in place of the semiconductor laser 30 described in the first through eighth embodiments.

Tenth Embodiment

Figure 18:
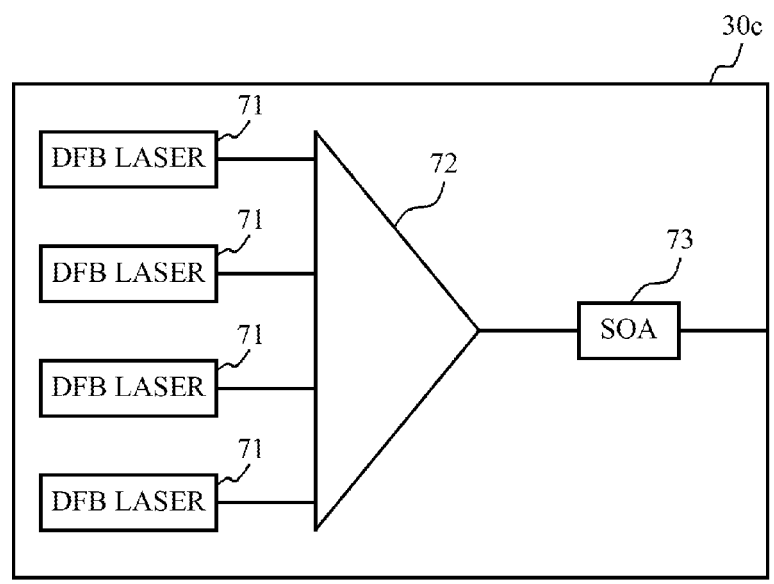
FIG. 18 discloses another example of a laser device that can be used in place of a semiconductor laser.

FIG. 18 discloses another example of a laser device that can be used in place of the semiconductor laser 30. As illustrated in FIG. 18, a laser module 30c includes DFB lasers 71, an optical coupler 72, and an optical amplifier 73. The DFB lasers 71 have different corrugation pitches. Or, semiconductor materials constituting active layers may be different. Such a configuration allows the DFB lasers 71 to achieve different oscillation wavelengths at the same temperature and the same drive current. The output from the DFB lasers 71 is coupled to the optical coupler 72. The optical coupler 72 couples the input light beam to the optical amplifier 73. The optical amplifier 73 amplifies and outputs the input light beam to the outside. When the output wavelength is selected, one DFB laser 71 covering the band of the target wavelength is first selected. Then, the temperature of the selected DFB laser 71 is controlled by the temperature control device 31 to achieve a desired oscillation wavelength. Therefore, the DFB lasers 71 corresponding to amounts capable of covering the whole of wavelength bands required for the laser module 30c are prepared. The non-selected DFB lasers 71 do not receive the supply of a drive electric power, and are in an off-state. The laser module illustrated in FIG. 18 may be used in place of the semiconductor laser 30 described in the first through eight embodiments.

Eleventh Embodiment

The above described embodiments use the principle that the oscillation wavelength shifts by a changed amount when the wavelength characteristics of the etalon 53, which is a wavelength detection means, are changed from an initial setting value to obtain the required wavelength. The present embodiment describes another method to achieve the required wavelength.

Figure 19:
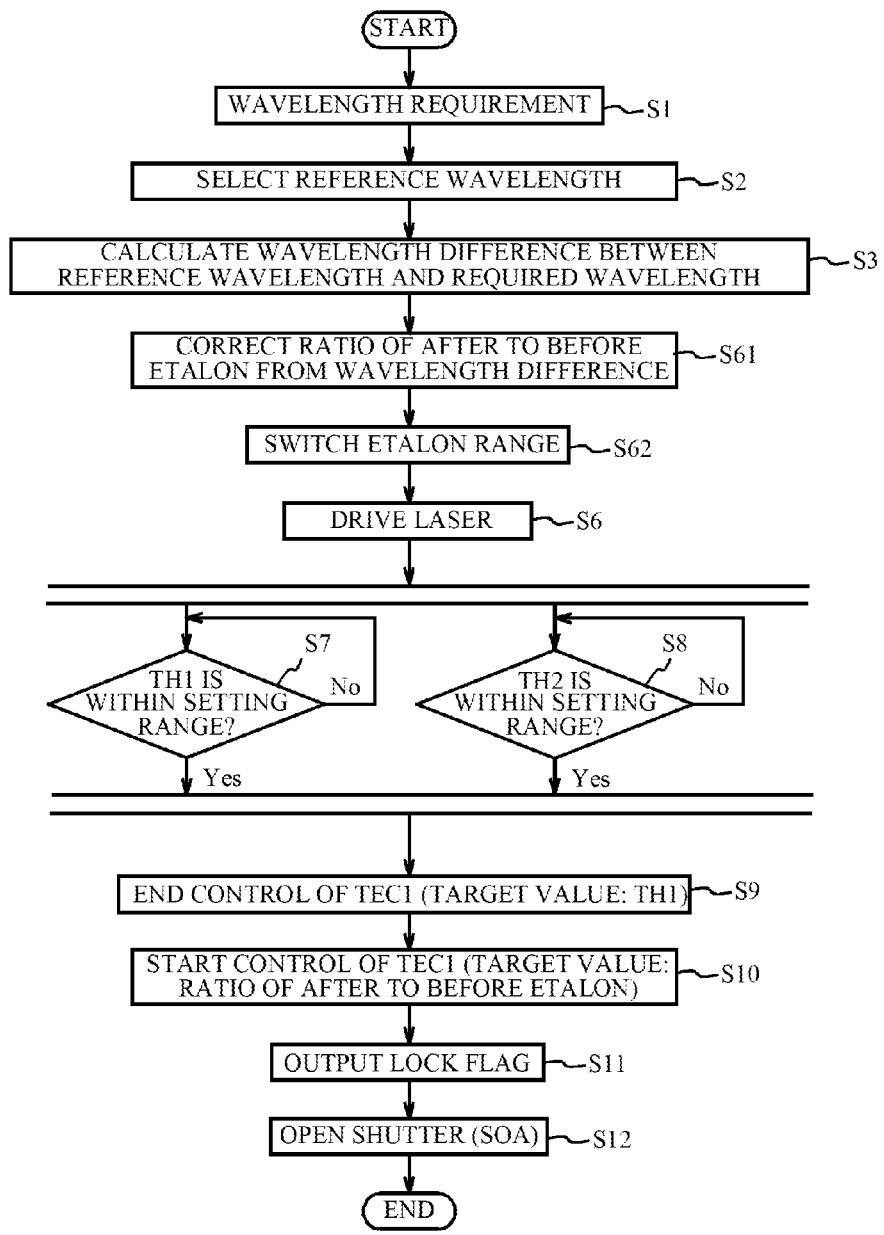
FIG. 19 is a diagram for explaining a control flow in accordance with an eleventh embodiment.

FIG. 19 is a diagram explaining a control flow in accordance with the present embodiment. In FIG. 19, the same step numbers are affixed to the steps same as those in the first embodiment, and the process thereof is the same as that of the first embodiment except that a comment is stated. The present embodiment receives a wavelength requirement (step S1). Then, the grid wavelength closest to the value of the received wavelength requirement (required wavelength) is selected, and is set as the reference wavelength (step 2).

Then, the wavelength difference ΔF between the required wavelength and the reference wavelength is calculated (step S3). Then, performed is calculation to obtain the after/before ratio to obtain the required wavelength from the after/before ratio $I_{m3}/I_{m2}$ to obtain the reference wavelength based on the wavelength difference ΔF. The calculation to obtain the after/before ratio uses the after/before ratio determined with respect to the reference wavelength, ΔF, and a ratio of a change in the after/before ratio to a change in wavelength. That is to say, the ratio of the change in the after/before ratio to the change in wavelength corresponds to the rate of change of wavelength of the drive condition. The execution of the above described calculation enables to calculate the after/before ratio when the required wavelength is achieved (step S61).

Figure 20:
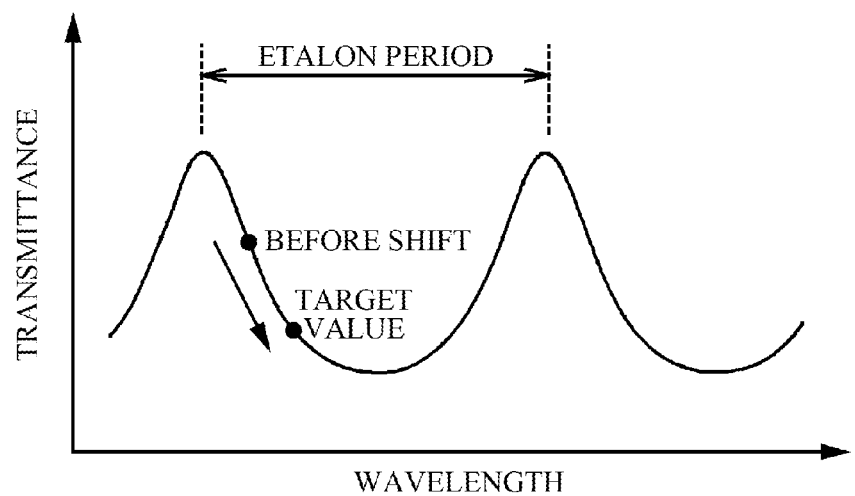
FIG. 20 is a diagram explaining wavelength characteristics of the etalon.

The wavelength characteristics of the etalon 53 are periodic as illustrated in FIG. 20. In addition, a ratio of the change in transmittance to the change in wavelength is small at a peak and a bottom of the period. Thus, the wavelength of the reference wavelength+ΔF (a target value to obtain the required wavelength) is evaluated, and the wavelength characteristics of the etalon 53 are shifted when it is determined that the wavelength is close to the wavelength at the peak or bottom (step S62). This process is executed by changing the temperature of the second temperature control device 54. This process corresponds to a process of switching a range of the wavelength detection of the etalon 53. After that, the same processes as steps S6 to S12 in the first embodiment are executed. The present embodiment corrects the ratio of after to before the etalon 53 to the value to achieve the required wavelength, and thus allows the semiconductor laser 30 to oscillate at the required wavelength.

Twelfth Embodiment

In the above described methods to achieve the required wavelength, the required wavelength is input from the outside at step S1. However, other methods may be employed instead of specifying the required wavelength itself from the outside. The present embodiment inputs a channel number and a wavelength difference between a wavelength corresponding to the channel number and a wavelength to be achieved (required wavelength). In this case, the memory 60 stores wavelengths corresponding to channel numbers.

In the present embodiment, when the channel number and the wavelength difference are input, the controller 70 reads out the wavelength corresponding to the channel number from the memory 60, and sets it as the reference wavelength. The present embodiment omits step S2 (selection of the reference wavelength) and step S3 (calculation of the wavelength difference between the reference wavelength and the required wavelength) in the first to eleventh embodiments. The present embodiment may employ the first to eleventh embodiments for the steps thereafter because the determined reference wavelength and the wavelength difference input from the outside in the present embodiment are obtained.

The present embodiment omits step S2 and step S3 and thus enables to simplify the control flow. The grid wavelength to be set as the reference wavelength may be specified instead of the channel number.

The present invention is not limited to the specifically disclosed embodiments and variations but may include other embodiments and variations without departing from the scope of the present invention.

What is claimed is:

1. A method of controlling a wavelength tunable laser to control an oscillation wavelength based on a difference between a detection result of a wavelength by a wavelength detecting unit and a target value, the method comprising:
acquiring a first drive condition of the wavelength tunable laser to make the wavelength tunable laser oscillate at a first wavelength from a memory;
calculating a second drive condition to drive the wavelength tunable laser at a second wavelength by referring to the first drive condition and a wavelength difference between the first wavelength and the second wavelength, the second wavelength differing from the first wavelength; and
driving the wavelength tunable laser based on the second drive condition calculated at the calculating of the second drive condition.

2. The method according to claim 1, wherein
the calculating of the second drive condition includes calculating a control value of a wavelength characteristic in the wavelength detecting unit or the target value.

3. The method according to claim 2, wherein
the wavelength detecting unit includes an etalon, and
the calculating of the second drive condition includes calculating a control value of a wavelength characteristic of the etalon to obtain the second wavelength at the target value associated with the first wavelength.

4. The method according to claim 3, wherein
the calculating of the control value of the wavelength characteristic of the etalon includes calculating a control value of temperature of the etalon.

5. The method according to claim 3, wherein
the wavelength tunable laser includes a semiconductor gain element, and
the etalon is mounted on a single temperature control device on which the semiconductor gain element is also mounted.

6. The method according to claim 1, further comprising:
driving the wavelength tunable laser under the second drive condition calculated at the calculating of the second drive condition after executing control to make the wavelength tunable laser oscillate at the first wavelength.

7. The method according to claim 2, wherein
the wavelength tunable laser includes a semiconductor laser capable of changing a wavelength by temperature; and
the calculating of the second drive condition includes calculating a temperature condition of the semiconductor laser to achieve the second wavelength based on a temperature condition of the semiconductor laser to achieve the first wavelength.

8. The method according to claim 2, wherein
the wavelength tunable laser includes an optical output control unit,
the wavelength detecting unit detects an output from the optical output control unit, and
the method further comprises:
performing control to increase an optical output of the optical output control unit after the wavelength detecting unit detects the second wavelength.

9. The method according to claim 2, wherein
the calculating of the second drive condition includes calculating the target value,
the wavelength detecting unit includes an etalon, and
the method further comprises:
performing control to switch a detection range of the etalon based on the calculated target value.

10. The method according to claim 1, wherein
the memory stores drive conditions for laser oscillation in association with different wavelengths, and
the acquiring of the first drive condition includes selecting a drive condition associated with the first wavelength from the stored drive conditions.

11. The method according to claim 10, further comprising:
determining the first wavelength based on information indicating the second wavelength before the acquiring of the first drive condition.

12. The method according to claim 10, further comprising:
acquiring information indicating the first wavelength and information indicating a wavelength difference between the first wavelength and the second wavelength before the acquiring of the first drive condition.

13. The method according to claim 1, further comprising:
receiving information indicating the second wavelength; and selecting the first wavelength for the acquiring of the first drive condition by referring to the second wavelength, before the acquiring of the first drive information.

14. A method of controlling a wavelength tunable laser to control an oscillation wavelength based on a difference between a detection result of a wavelength by a wavelength detecting unit and a target value, the method comprising:
- acquiring a first drive condition of the wavelength tunable laser to make the wavelength tunable laser oscillate at a first wavelength from a memory;
- calculating a second drive condition to drive the wavelength tunable laser at a second wavelength by referring to the first drive condition and a wavelength difference between the first wavelength corresponding to a grid wavelength and the second wavelength corresponding to a wavelength other than the grid, the second wavelength differing from the first wavelength;
- driving the wavelength tunable laser based on the second drive condition calculated at the calculating of the second drive condition; and
- adjusting a drive condition of the wavelength tunable laser such that the oscillation equal to a target wavelength of the second drive condition.

* * * * *